(12) United States Patent
Andoh et al.

(10) Patent No.: US 6,169,461 B1
(45) Date of Patent: Jan. 2, 2001

(54) HIGH-FREQUENCY OSCILLATING CIRCUIT

(75) Inventors: Toshiaki Andoh, Kadoma; Makoto Sakakura, Uji; Takeshi Miura, Yokohama; Hiroaki Kosugi, Hirakata; Kaoru Ishida, Shijonawate, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/123,163

(22) Filed: Jul. 27, 1998

(30) Foreign Application Priority Data

| Jul. 25, 1997 | (JP) | ................................................. 9-199596 |
| Oct. 21, 1997 | (JP) | ................................................. 9-288581 |
| Apr. 21, 1998 | (JP) | ................................................. 10-110827 |

(51) Int. Cl.$^7$ .................................................... H03B 5/18
(52) U.S. Cl. ................................. 331/117 D; 331/108 C; 331/132; 331/114; 331/115; 331/107 SL; 331/108 D; 331/177 V
(58) Field of Search ......................... 331/117 R, 117 D, 331/108 C, 132, 74, 107 SL, 177 V, 56, 100, 114, 115, 108 D

(56) References Cited

U.S. PATENT DOCUMENTS

| 3,939,429 | 2/1976 | Löhn et al. . |
| 4,998,077 | 3/1991 | Nanni et al. ............................ 331/57 |
| 5,187,450 | * 2/1993 | Wagner et al. ......................... 331/96 |
| 5,418,500 | 5/1995 | Igarashi ................................. 331/76 |
| 5,629,562 | 5/1997 | Weiss ................................. 331/108 B |
| 5,638,030 | 6/1997 | Du ......................................... 331/99 |

FOREIGN PATENT DOCUMENTS

| 0 660 504 A1 | 6/1995 | (EP) . |
| 06303034 | 10/1994 | (JP) . |

OTHER PUBLICATIONS

European Search Report, Application No. EP98113835.7, dated July 29, 1999.
Mizukami H. et al.: "A High Quality Gaas IC Tuner For TV/VCR Receivers", IEEE Transactions on Consumer Electronics, vol. 34, No. 3, Aug., 1988, pp. 649–658, XP000029685.
European Search Report, Application No. EP98113835, dated Nov. 12, 1998.

* cited by examiner

*Primary Examiner*—Arnold Kinkead
(74) *Attorney, Agent, or Firm*—Ratner & Prestia

(57) ABSTRACT

A high-frequency oscillating circuit that is not degraded by external electromagnetic interference. The high-frequency oscillating circuit includes first and second oscillating transistors wherein the bases are connected together directly or via a capacitor having a sufficiently low impedance at an oscillating frequency, and wherein a differential signal output is obtained between the emitters of the first and second oscillating transistors. Also provided is a resonating circuit formed in a module and a separate negative-resistance-generating circuit formed on an integrated circuit for achieving an oscillator that has a high Q factor and a high C/N ratio.

28 Claims, 19 Drawing Sheets

HIGH-FREQUENCY OSCILLATING CIRCUIT

BACKGROUND OF THE INVENTION

1. Field of the Invention

The present invention relates to a high-frequency oscillating circuit such as a voltage-controlled oscillator in a radio communication apparatus such as a cellular telephone or a satellite communication apparatus.

2. Description of the Prior Art

Conventional techniques are described with reference to the drawings.

FIG. 19 is a circuit diagram of a conventional high-frequency oscillating circuit. In this figure, 1 and 17 are oscillating transistors; 2, 3, 4, 18, 19, and 20 are capacitors; 5 and 21 are resonator coupling capacitors; 6 and 22 are output coupling capacitors; 7 is a resonator; 8 and 23 are varactor diode coupling capacitors; 9 and 24 are varactor diodes; 11, 12, 13, 26, 27, and 28 are biasing resistors; 14 and 29 are varactor diode bias chokes; 15 and 16 are high-frequency output terminals; 10, 25, and 30 are high-frequency chokes; 31 and 32 are bypass capacitors; 33 is a tuning voltage supply terminal; and 34 is a bias voltage supply terminal.

Conventional high-frequency oscillating circuits of this configuration operate as follows.

In FIG. 19, the oscillating transistors 1 and 17 have their base terminal grounded via the capacitors 4 and 20, respectively, having a sufficiently low impedance in an oscillating frequency band. The capacitors 2 and 18 are connected to the transistors 1 and 17, respectively, as collector-to-emitter capacitive elements. In addition, the capacitors 3 and 19 are connected between the ground and the emitters of the transistors 1 and 17, respectively, and are equivalently connected between the emitter and the base because this circuit is of a grounded base type. Furthermore, the resonator 7, which is connected via the resonator coupling capacitors 5 and 21, is a half-length resonator with its tip open. Since the middle point of the resonator equivalently acts as a short-circuit point for the ground, the resonator 7 is equivalently connected between the collector and base of the transistor 1 via the resonator coupling capacitor 5 as an inductive element and between the collector and base of the transistor 17 via the capacitor 21 as an inductive element.

Thus, in the circuit in FIG. 19, two grounded-base clap oscillating circuits perform oscillating operations by using one half-length resonator to provide oscillating signals the phases of which are mutually shifted through 180°, and their output is obtained from between the high-frequency output terminals 15 and 16 via the output coupling capacitors 6 and 22 as a differential signal output between the two circuits.

In addition, the varactor diodes 9 and 24 are each connected to the resonator 7 via the varactor diode coupling capacitors 8 and 23, respectively. Furthermore, since the anodes of the varactor diodes 9 and 24 are provided with the ground potential by the varactor diode bias chokes 14 and 29 in a DC manner, the value of a voltage applied to the tuning voltage supply terminal 33 via the high-frequency choke coil 30 varies the values of the capacity of the varactor diodes 9 and 24 to enable the oscillating frequency to be varied.

In addition, the oscillating circuit, which performs such circuit operations, can use an IC process to provide on an IC, elements including not only the oscillating transistors 1 and 17 and their peripherals but also the resonator 7 and a resonating circuit composed of the varactor diodes 9 and 24.

In the above configuration, however, the capacitors 3, 4, 19, and 20 are connected to the ground, so if an external electromagnetic interference occurs, a potential difference may occur on the ground surface of a circuit board on which the circuits are mounted, thereby losing the balance between the two transistors to degrade the S/N ratio.

In addition, since the resonator 7 and varactor diodes 9 and 24 are formed on an IC chip using the IC process, it is not easy to produce elements having a high Q factor, that is, a small loss. Consequently, this resonating circuit for an oscillating circuit IC cannot easily achieve a high Q factor, so it is difficult to provide a high C/N ratio for the oscillating circuit IC.

SUMMARY OF THE INVENTION

In view of these problems, it is an object of this invention to provide a high-frequency oscillating circuit that does not have its characteristics such as the S/N ratio degraded under an external electromagnetic interference.

It is another object of this invention to provide a resonating circuit for an oscillating circuit IC that can provide a high Q factor and a high-frequency oscillating circuit using this resonating circuit so as to obtain a high C/N ratio.

This invention is a high-frequency oscillating circuit comprising a first and a second oscillating transistors, wherein the bases of the first and second transistors are connected together directly or via a capacitor the impedance of which is lower than a predetermined value at an oscillating frequency, and wherein a differential signal output is obtained from between the emitters of the first and second oscillating transistors as an oscillating output.

According to this configuration, the capacitor connected between the base of the oscillating transistor and the ground is not connected to a ground pattern on a mounting circuit board, but the base electrodes of the two oscillating transistors are connected together directly or via the capacitor. Thus, differential oscillating operations can be performed at a high frequency without the use of the ground pattern on the mounting circuit board, so a high-frequency oscillating circuit can be provided that is not affected by a common mode noise source occurring in the ground pattern on the mounting circuit board or that does not have its characteristics such as the S/N ratio degraded even if an external electromagnetic interference occurs.

In particular, if both bases are directly connected together, this eliminates the load of an impedance unwanted for the bases at the oscillating frequency, thereby providing a high-frequency oscillating circuit that does not have its characteristics such as the S/N ratio degraded.

In addition, this invention is a high-frequency oscillating circuit comprising a first and a second oscillating transistors, wherein the collectors of the first and second transistors are connected together directly or via a capacitor the impedance of which is lower than a predetermined value at an oscillating frequency, and wherein a differential signal output is obtained from between the emitters of the first and second oscillating transistors as an oscillating output.

According to this configuration, the capacitor connected between the collector of the oscillating transistor and the ground is not connected to a ground pattern on a mounting circuit board, but the collector electrodes of the two oscillating transistors are connected together directly or via the capacitor. Thus, differential oscillating operations can be performed at a high frequency without the use of the ground pattern on the mounting circuit board, so a high-frequency oscillating circuit can be provided that is not affected by a common mode noise source occurring in the ground pattern on the mounting circuit board or that does not have its characteristics such as the S/N ratio degraded even if an external electromagnetic interference occurs.

In particular, if both collectors are directly connected together, this eliminates the load of an impedance unwanted for the collectors at the oscillating frequency, thereby providing a high-frequency oscillating circuit that does not have its characteristics such as the S/N ratio degraded.

In addition, according to this invention, a resonator, varactor diodes, and capacitors and chokes constituting a resonating circuit for an oscillating circuit IC are integrated together as module separate from a negative-resistance-generating circuit configured as an IC and including oscillating transistors.

Thus, a high Q factor can be obtained by forming the resonator of a strip conductor on a dielectric substrate. In addition, instead of the use of the IC process, the varactor diodes can comprise conventional unitary discrete elements to increase the Q factor and the capacity ratio, thereby providing a resonating circuit with a high Q factor. Thus, a combination of such a resonating circuit with an oscillating circuit IC can provide an oscillating circuit IC with a high C/N ratio.

As is apparent from the above description, this invention directly connects the bases and emitters of the two oscillating transistors or their collectors and emitters together via the capacitor instead of the ground, the characteristics such as the S/N ratio are not degraded despite an external electromagnetic interference.

This invention is also advantageous in that a common collector current path is used for oscillating transistors and buffer amplifier transistors to reduce the current consumption.

This invention is also advantageous in that a Q factor and capacity ratio can be increased, thereby providing a resonating circuit with a high Q factor. Thus a combination of such a resonating circuit with an oscillating circuit IC can provide an oscillating circuit with a high C/N ratio.

This invention is also advantageous in that a base grounding capacitor connected between the two oscillating transistors is not connected but the bases or collectors of the two oscillating transistors are directly connected together, thereby providing a high-frequency oscillating circuit that is not affected by the impedance of the grounding capacitor or that does not have its characteristics such as the S/N ratio degraded.

Furthermore, according to this invention, even if a buffer amplifier is connected to the oscillating circuit, the capacitor connected between the emitters of the two buffer amplifier transistors is not connected but the emitters of the two buffer amplifier transistors are directly connected together, thereby providing a high-frequency oscillating circuit that is not affected by the impedance of the grounding capacitor or that does not have its characteristics such as the S/N ratio degraded.

DETAILED DESCRIPTION OF THE PREFERRED EMBODIMENTS

This invention is described below with reference to drawings showing its embodiments.

(Embodiment 1)

Figure 1:
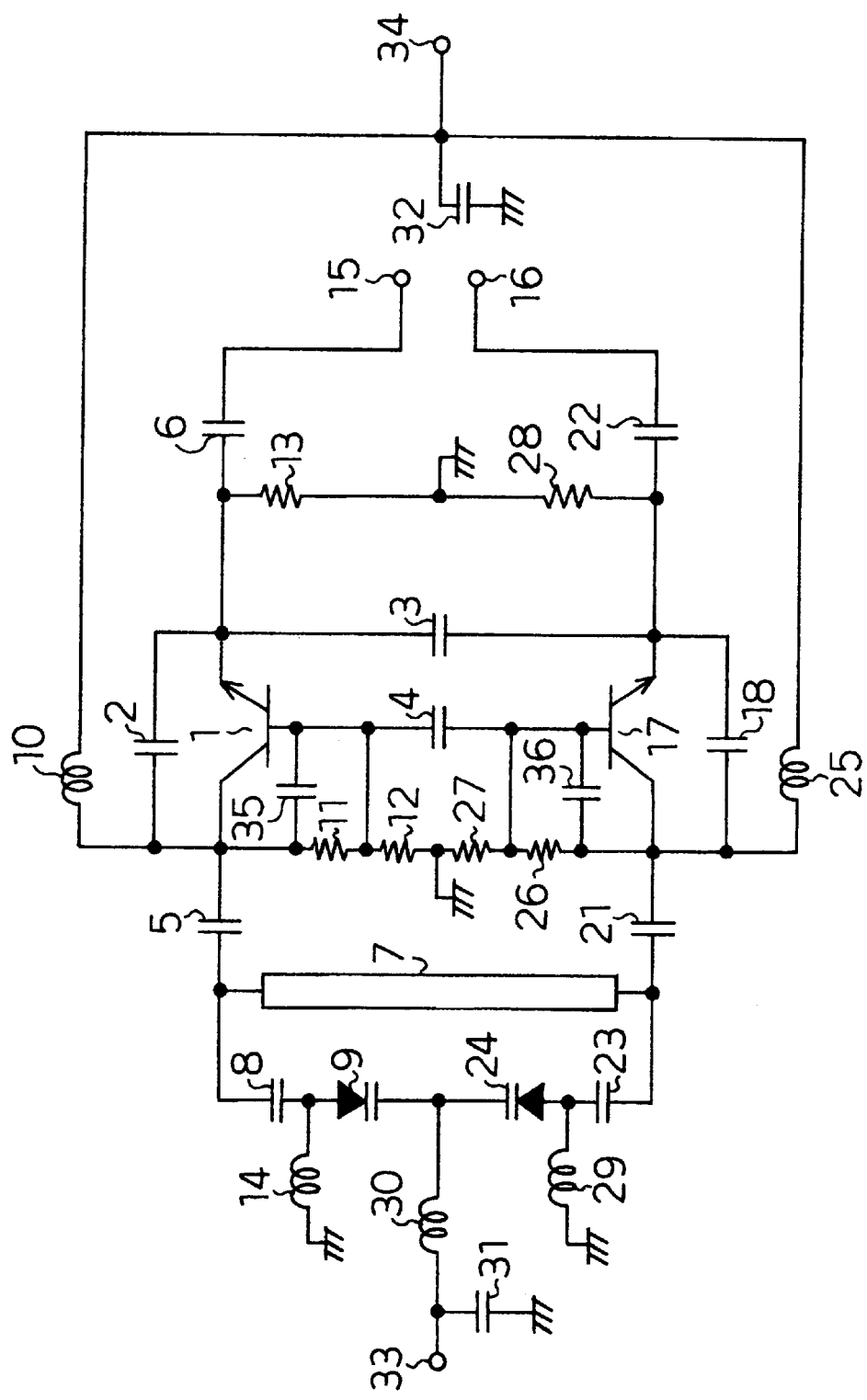
FIG. 1 is a circuit diagram showing a high-frequency oscillating circuit of a first embodiment according to this invention.

FIG. 1 is a circuit diagram showing a high-frequency oscillating circuit of a first embodiment according to this invention. In this figure, 1 and 17 are oscillating transistors; 2, 3, 4, 18, 35, and 36 are capacitors; 5 and 21 are resonator coupling capacitors; 6 and 22 are output coupling capacitors; 7 is a resonator; 8 and 23 are varactor diode coupling capacitors; 9 and 24 are varactor diodes; 11, 12, 13, 26, 27, and 28 are biasing resistors; 14 and 29 are varactor diode bias chokes; 15 and 16 are high-frequency output terminals; 10, 25, and 30 are high-frequency chokes; 31 and 32 are bypass capacitors; 33 is a tuning voltage supply terminal; and 34 is a bias voltage supply terminal. In this case, the oscillating transistor 1 is a first oscillating transistor, and the oscillating transistor 17 is a second oscillating transistor. The capacitors 4 and 3 have a sufficiently low impedance (lower than a specified value) at an oscillating frequency to allow oscillation to occur. This applies to each of the following embodiments.

The high-frequency oscillating circuit of this configuration according to the first embodiment operates as follows.

In FIG. 1, the oscillating transistors 1 and 17 have their base terminal connected via the capacitor 4, respectively, having a sufficiently low impedance in an oscillating frequency band. The capacitors 2 and 18 are connected to the transistors 1 and 17 as collector-to-emitter capacitive elements the values of which are selected to provide an optimal C/N ratio in the oscillating frequency band. The capacitors 35 and 36 are connected to the transistors 1 and 17 as collector-to-base capacitive elements the values of which are selected to provide an optimal C/N ratio in the oscillating frequency band. In addition, the capacitor 3 is connected between the emitters of the transistors 1 and 17 and its element value is selected to provide an optimal C/N ratio in the oscillating frequency band. Furthermore, the resonator 7, which is connected via the resonator coupling capacitors 5 and 21, is a half-length resonator with its tip open. Since the middle point of the resonator equivalently acts as a short-circuit point for the ground, the resonator 7 is equivalently connected between the collector and base of the transistor 1 via the resonator coupling capacitor 5 as an inductive element and between the collector and base of the transistor 17 via the capacitor 21 as an inductive element.

In addition, the varactor diodes 9 and 24 are each connected to the resonator 7 via the varactor diode coupling capacitors 8 and 23, respectively. Furthermore, since the anodes of the varactor diodes 9 and 24 are provided with the ground potential by the varactor diode bias chokes 14 and 29 in a DC manner, the value of a voltage applied to the tuning voltage supply terminal 33 via the high-frequency choke coil 30 varies the values of the capacity of the varactor diodes 9 and 24 to enable the oscillating frequency to be varied.

Thus, in the circuit in FIG. 1, two grounded-base clap oscillating circuits perform oscillating operations by using one half-length resonator to provide oscillating signals the phases of which are mutually shifted through 180°, and their output is obtained from between the high-frequency output terminals 15 and 16 via the output coupling capacitors 6 and 22 as a differential signal output between the two circuits.

According to this configuration, the base grounding capacitor and emitter-to-ground capacitor conventionally connected between the oscillating transistor and the ground are not connected to a ground pattern on a mounting circuit board, but are directly connected between the bases and emitters of the two oscillating transistors. Thus, differential oscillating operations can be performed at a high frequency without the use of the ground pattern on the mounting circuit board. Accordingly, a high-frequency oscillating circuit can be provided that is not affected by a potential difference occurring in the ground pattern on the mounting circuit board or that does not have its characteristics such as the S/N ratio degraded even if an external electromagnetic interference occurs.

Figure 2:
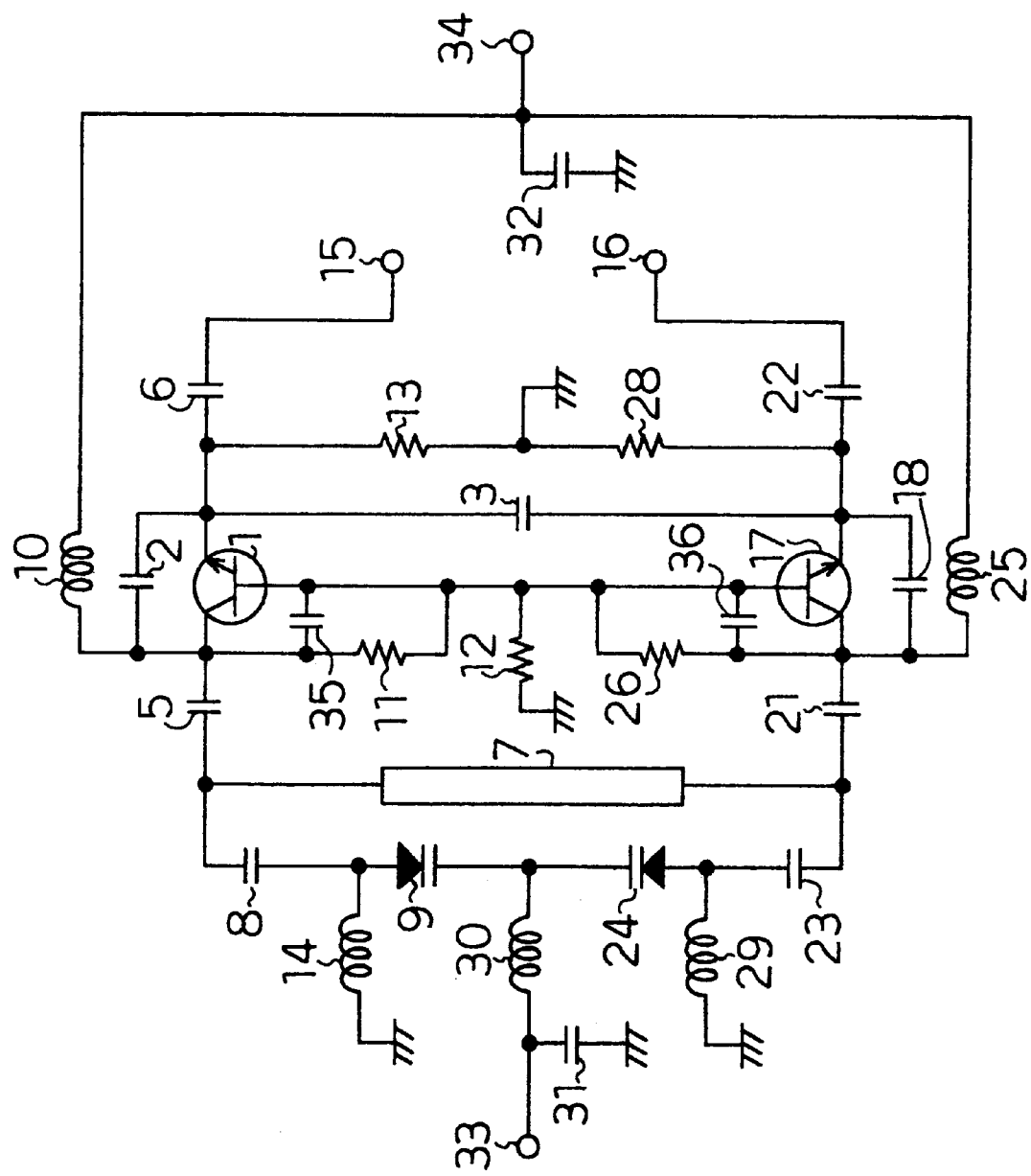
FIG. 2 is a circuit diagram showing another example of a high-frequency oscillating circuit of the first embodiment.

FIG. 2 is a circuit diagram showing another example of a high-frequency oscillating circuit of the present embodiment. In this figure, 1 and 17 are oscillating transistors; 2, 3, 18, 35, and 36 are capacitors; 5 and 21 are resonator coupling capacitors; 6 and 22 are output coupling capacitors; 7 is a resonator; 8 and 23 are varactor diode coupling capacitors; 9 and 24 are varactor diodes; 11, 12, 13, 26, and 28 are biasing resistors; 14 and 29 are varactor diode bias chokes; 15 and 16 are high-frequency output terminals; 10, 25, and 30 are high-frequency chokes; 31 and 32 are bypass capacitors; 33 is a tuning voltage supply terminal; and 34 is a bias voltage supply terminal.

The high-frequency oscillating circuit of this configuration according to this embodiment operates as follows.

In FIG. 2, the oscillating transistors 1 and 17 have their base terminals directly connected together. The capacitors 2 and 18 are connected to the transistors 1 and 17, respectively, as collector-to-emitter capacitive elements the values of which are selected to provide an optimal C/N ratio in the oscillating frequency band. The capacitors 35 and 36 are connected to the transistors 1 and 17 as collector-to-base capacitive elements the values of which are selected to provide an optimal C/N ratio in the oscillating frequency band.

In addition, the capacitor 3 is connected between the emitters of the transistors 1 and 17 and its element value is selected to provide an optimal C/N ratio in the oscillating frequency band. Furthermore, the resonator 7, which is connected via the resonator coupling capacitors 5 and 21, is a half-length resonator with its tip open. Since the middle point of the resonator equivalently acts as a short-circuit point for the ground, the resonator 7 is equivalently connected between the collector and base of the transistor 1 via the resonator coupling capacitor 5 as an inductive element and between the collector and base of the transistor 17 via the capacitor 21 as an inductive element.

In addition, the varactor diodes 9 and 24 are each connected to the resonator 7 via the varactor diode coupling capacitors 8 and 23, respectively. Furthermore, since the anodes of the varactor diodes 9 and 24 are provided with the ground potential by the varactor diode bias chokes 14 and 29 in a DC manner, the value of a voltage applied to the tuning voltage supply terminal 33 via the high-frequency choke coil 30 varies the values of the capacity of the varactor diodes 9 and 24 to enable the oscillating frequency to be varied.

Thus, in the circuit in FIG. 2, two grounded-base clap oscillating circuits perform oscillating operations by using one half-length resonator to provide oscillating signals the phases of which are mutually shifted through 180°, and their output is obtained from between the high-frequency output terminals 15 and 16 via the output coupling capacitors 6 and 22 as a differential signal output between the two circuits.

According to this configuration, the base electrodes of the oscillating transistor are directly connected to eliminate an impedance element that acts as a source of noise in the base at a high frequency without the need to connect the base grounding capacitor conventionally connected between the bases of the oscillating transistors. As a result, a high-frequency oscillating circuit can be provided that does not have its characteristics such as the S/N ratio degraded
(Embodiment 2)

Figure 3:
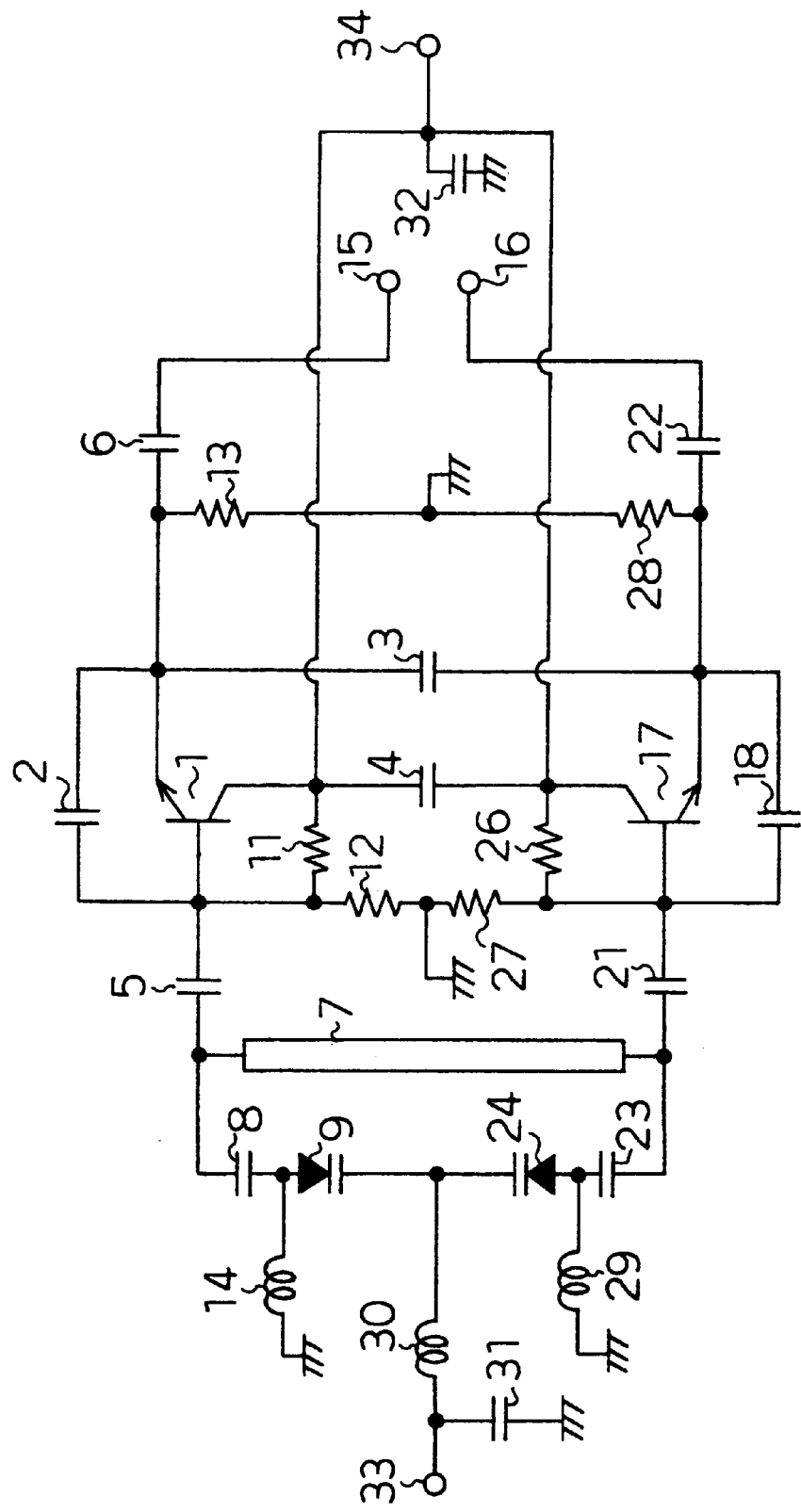
FIG. 3 is a circuit diagram showing a high-frequency oscillating circuit of a second embodiment according to this invention.

FIG. 3 is a circuit diagram showing a high-frequency oscillating circuit of a second embodiment according to this invention. In this figure, 1 and 17 are oscillating transistors; 2, 3, 4, and 18 are capacitors; 5 and 21 are resonator coupling capacitors; 6 and 22 are output coupling capacitors; 7 is a resonator; 8 and 23 are varactor diode coupling capacitors; 9 and 24 are varactor diodes; 11, 12, 13, 26, 27, 28 are biasing resistors; 14 and 29 are varactor diode bias chokes; 15 and 16 are high-frequency output terminals; 30 is a high-frequency choke; 31 and 32 are bypass capacitors; 33 is a tuning voltage supply terminal; and 34 is a bias voltage supply terminal.

The high-frequency oscillating circuit of this configuration according to the second embodiment operates as follows.

In FIG. 3, the oscillating transistors 1 and 17 have their collector terminals connected via the capacitor 4 having a sufficiently low impedance in the oscillating frequency band. The capacitors 2 and 18 are connected to the transistors 1 and 17 as base-to-emitter capacitive elements the values of which are selected to provide an optimal C/N ratio in the oscillating frequency band. The capacitor 3 is connected between the emitters of the transistors 1 and 17 and its element value is selected to provide an optimal C/N ratio in the oscillating frequency band. Furthermore, the resonator 7, which is connected via the resonator coupling capacitors 5 and 21, is a half-length resonator with its tip open. Since the middle point of the resonator acts as a short-circuit point for the ground, the resonator 7 is equivalently connected between the collector and base of the transistor 1 via the resonator coupling capacitor 5 as an inductive element and between the collector and base of the transistor 17 via the capacitor 21 as an inductive element.

In addition, the varactor diodes 9 and 24 are each connected to the resonator 7 via the varactor diode coupling capacitors 8 and 23, respectively. Furthermore, since the anodes of the varactor diodes 9 and 24 are provided with the ground potential by the varactor diode bias chokes 14 and 29 in a DC manner, the value of a voltage applied to the tuning voltage supply terminal 33 via the high-frequency choke coil 30 varies the values of the capacity of the varactor diodes 9 and 24 to enable the oscillating frequency to be varied.

Thus, in the circuit in FIG. 3, two grounded-collector clap oscillating circuits perform oscillating operations by using one half-length resonator to provide oscillating signals the phases of which are mutually shifted through 180°, and their output is obtained from between the high-frequency output terminals 15 and 16 via the output coupling capacitors 6 and 22 as a differential signal output between the two circuits.

According to this configuration, the collector grounding capacitor and emitter-to-ground capacitor conventionally connected between the oscillating transistor and the ground are not connected to a ground pattern on a mounting circuit board, but are directly connected between the collectors and emitter electrodes of the two oscillating transistors. Thus, differential oscillating operations can be performed at a high frequency without the use of the ground pattern on the mounting circuit board, so a high-frequency oscillating circuit can be provided that is not affected by a potential difference occurring in the ground pattern on the mounting circuit board or that does not have its characteristics such as the SIN ratio degraded even if an external electromagnetic interference occurs.

Figure 4:
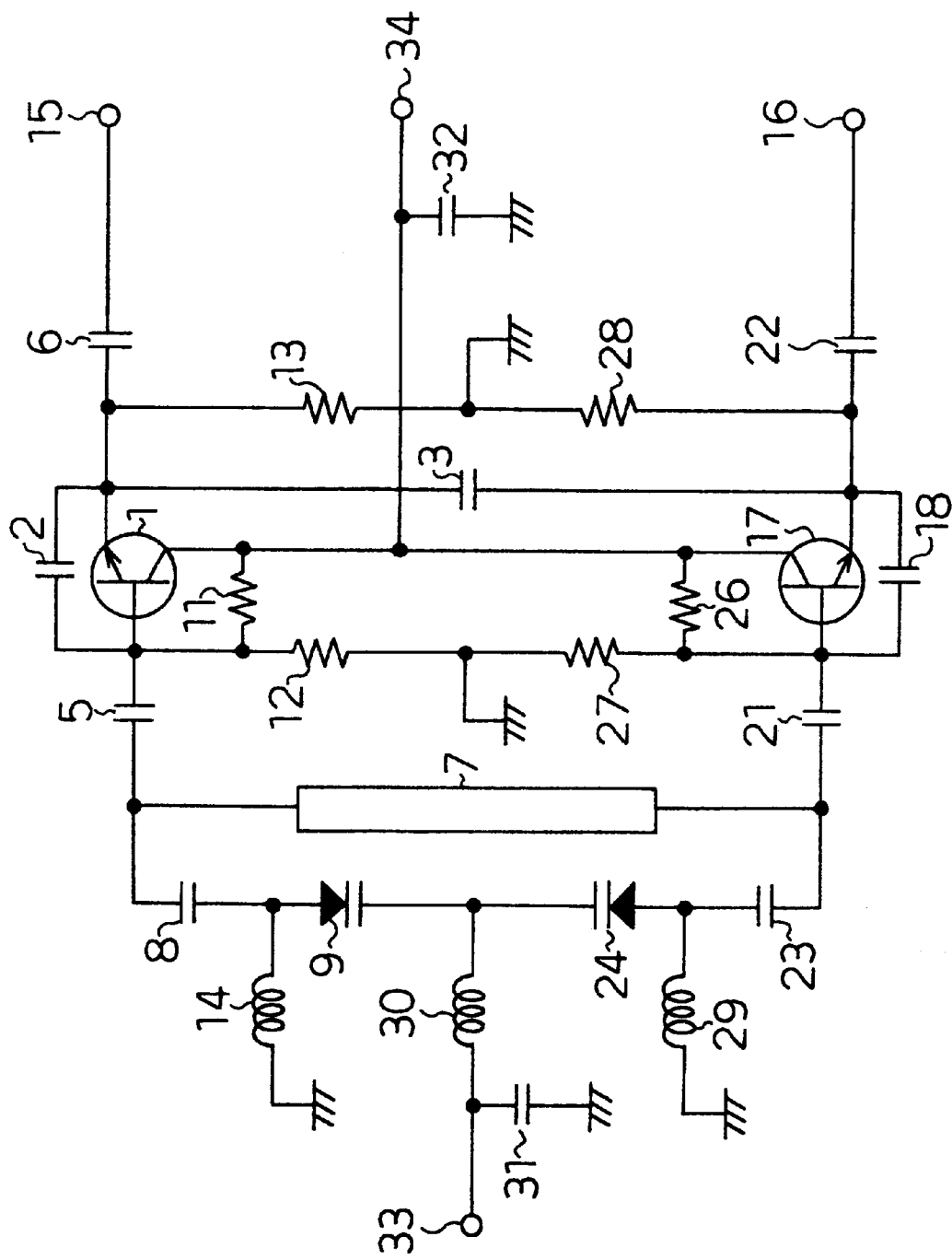
FIG. 4 is a circuit diagram showing another example of a high-frequency oscillating circuit of the second embodiment.

FIG. 4 is a circuit diagram showing another example of a high-frequency oscillating circuit of the second embodiment. In this figure, 1 and 17 are oscillating transistors; 2, 3, and 18 are capacitors; 5 and 21 are resonator coupling capacitors; 6 and 22 are output coupling capacitors; 7 is a resonator; 8 and 23 are varactor diode coupling capacitors; 9 and 24 are varactor diodes; 11, 12, 13, 26, 27, and 28 are biasing resistors; 14 and 29 are varactor diode bias chokes; 15 and 16 are high-frequency output terminals; 30 is a high-frequency choke; 31 and 32 are bypass capacitors; 33 is a tuning voltage supply terminal; and 34 is a bias voltage supply terminal.

The high-frequency oscillating circuit of this configuration according to the second embodiment operates as follows.

In FIG. 4, the oscillating transistors 1 and 17 have their collector terminals directly connected together. The capacitors 2 and 18 are connected to the transistors 1 and 17, respectively, as base-to-emitter capacitive elements the values of which are selected to provide an optimal C/N ratio in the oscillating frequency band.

The capacitor 3 is connected between the emitters of the transistors 1 and 17 and its element value is selected to provide an optimal C/N ratio in the oscillating frequency band. Furthermore, the resonator 7, which is connected via the resonator coupling capacitors 5 and 21, is a half-length resonator with its tip open. Since the middle point of the resonator equivalently acts as a short-circuit point for the ground, the resonator 7 is equivalently connected between the collector and base of the transistor 1 via the resonator coupling capacitor 5 as an inductive element and between the collector and base of the transistor 17 via the capacitor 21 as an inductive element.

In addition, the varactor diodes 9 and 24 are each connected to the resonator 7 via the varactor diode coupling capacitors 8 and 23, respectively. Furthermore, since the anodes of the varactor diodes 9 and 24 are provided with the ground potential by the varactor diode bias chokes 14 and 29 in a DC manner, the value of a voltage applied to the tuning voltage supply terminal 33 via the high-frequency choke coil 30 varies the values of the capacity of the varactor diodes 9 and 24 to enable the oscillating frequency to be varied.

Thus, in the circuit in FIG. 4, two grounded-collector clap oscillating circuits perform oscillating operations by using one half-length resonator to provide oscillating signals the phases of which are mutually shifted through 180°, and their output is obtained from between the high-frequency output terminals 15 and 16 via the output coupling capacitors 6 and 22 as a differential signal output between the two circuits.

According to this configuration, the collector melectrodes of the oscillating transistor are directly connected to eliminate an impedance element that acts as a source of noise in the collector at a high frequency without the need to connect the collector grounding capacitor conventionally connected between the collectors of the oscillating transistors. As a result, a high-frequency oscillating circuit can be provided that does not have its characteristics such as the S/N ratio degraded.

(Embodiment 3)

Figure 5:
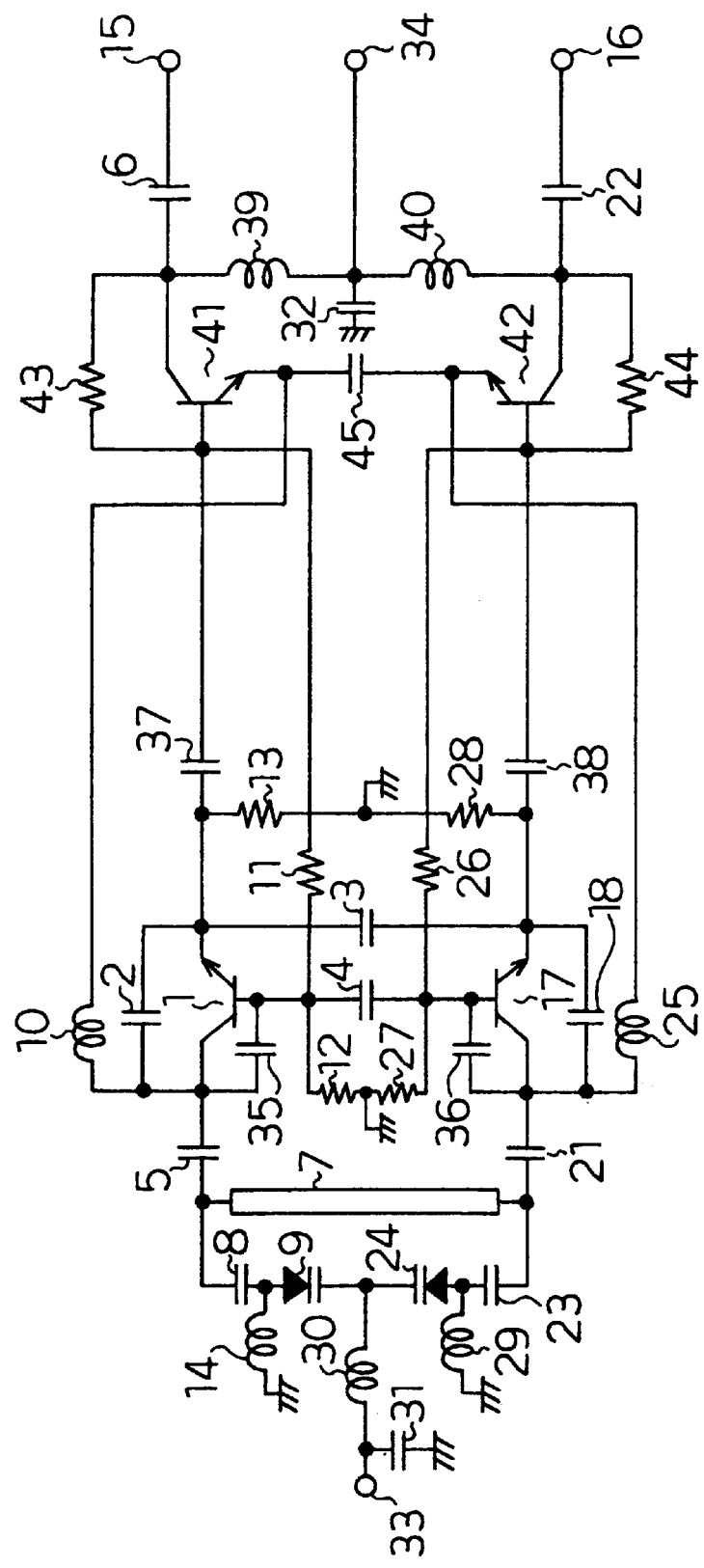
FIG. 5 is a circuit diagram showing a high-frequency oscillating circuit of a third embodiment according to this invention.

FIG. 5 is a circuit diagram showing a high-frequency oscillating circuit of a third embodiment according to this invention. In this figure, 41 and 42 are buffer amplifier transistors; 43 and 44 are biasing resistors; 45 is a capacitor; 32 is a bypass capacitor; 39 and 40 are high-frequency choke coils; 37 and 38 are inter-stage coupling capacitors; 6 and 22 are output coupling capacitors; 34 is a bias voltage supply terminal; and 15 and 16 are high-frequency output terminals. In this case, the oscillating transistor 1 is a first oscillating transistor, the oscillating transistor 17 is a second oscillating transistor, the buffer amplifier transistor 41 is a first buffer amplifier transistor, and the buffer amplifier transistor 42 is a second buffer amplifier transistor. The other components are the same as in FIG. 1.

The high-frequency oscillating circuit of this configuration according to the third embodiment operates as follows.

In FIG. 5, the oscillating transistors 1 and 17 constitute a grounded-base clap oscillating circuit and perform oscillating operations by providing oscillating signals the phases of which are mutually shifted through 180°, as in the first embodiment. Their outputs are amplified by the buffer amplifier transistors 41 and 42 via the inter-stage coupling capacitors 37 and 38 and are then obtained from between the high-frequency output terminals 15 and 16 through the output coupling capacitors 6 and 22 as a differential signal output.

The buffer amplifier transistors 41 and 42 are of a grounded-emitter differential-amplifying circuit form. As the grounding capacitor, a capacitor 45 having a sufficiently low impedance in the oscillating frequency band directly connects the emitters of the two buffer amplifier transistors, as in the oscillating transistors 1 and 17.

As described above, the emitter grounding capacitor conventionally connected between the buffer amplifier transistor and the ground is not connected to a ground pattern on a mounting circuit board, but is directly connected between the emitter electrodes of the two oscillating transistors. Thus, differential circuit operations with the oscillating circuit and buffer amplifier sections can be performed at a high frequency without the use of the ground pattern on the mounting circuit board, thereby providing a high-frequency oscillating circuit that is not affected by a potential difference occurring in the ground pattern on the mounting circuit board or that does not have its characteristics such as the S/N ratio degraded even if an external electromagnetic interference occurs.

In addition, in a DC bias circuit, the collectors of the oscillating transistors 1 and 17 are connected to the emitters of the buffer amplifier transistors 41 and 42 through the high-frequency chokes 10 and 25. Thus, the same collector current path is used for the buffer amplifier transistor 41 and oscillating transistor 1, and the same collector current path is similarly used for the buffer amplifier transistor 42 and oscillating transistor 17.

This configuration provides a high-frequency oscillating circuit that can reduce current consumption compared to a circuit using separate current paths to provide collector currents to the oscillating and buffer amplifier transistors.

Figure 6:
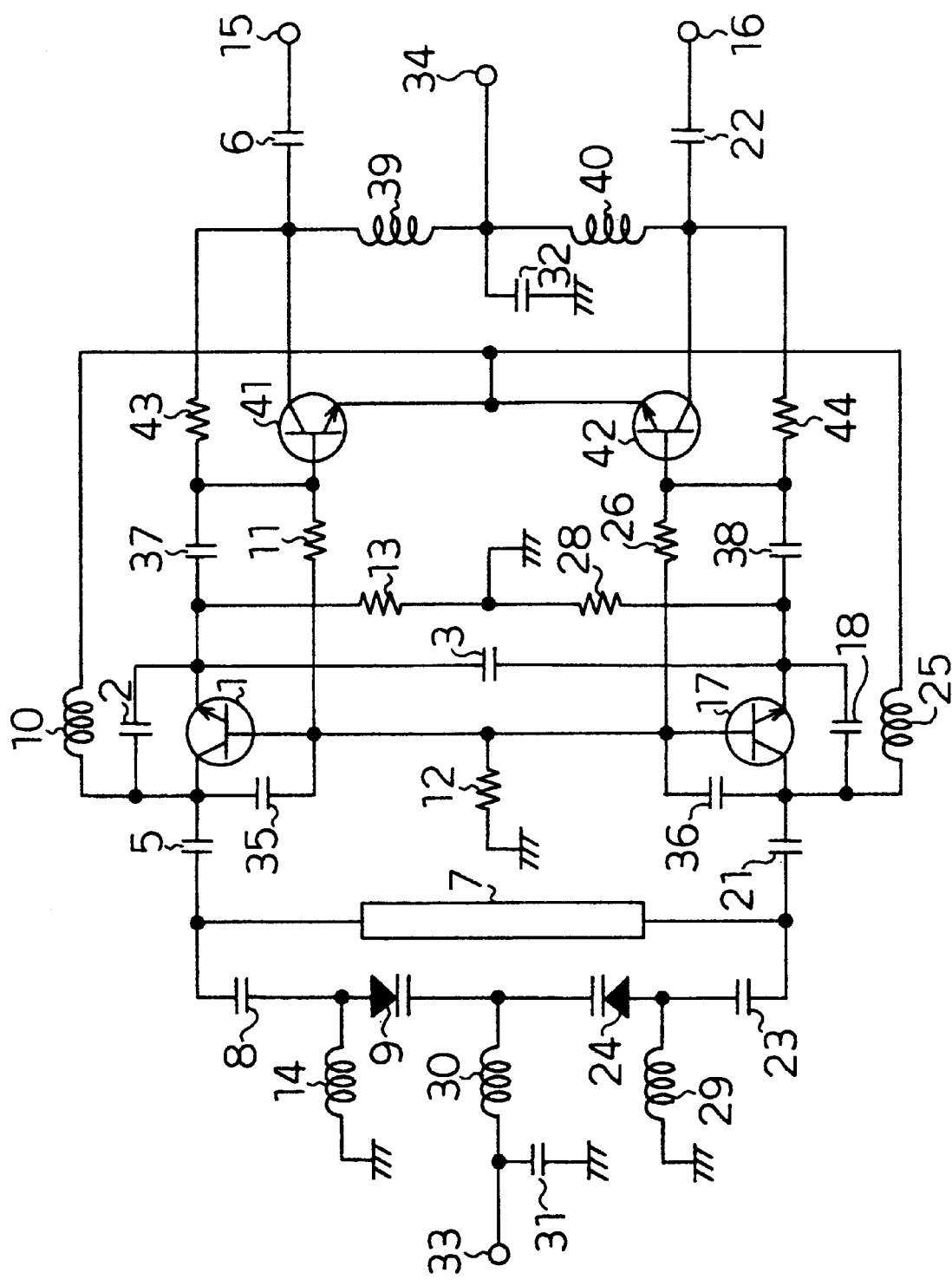
FIG. 6 is a circuit diagram showing another example of a high-frequency oscillating circuit of the third embodiment.

FIG. 6 is a circuit diagram showing another example of a high-frequency oscillating circuit according to the third embodiment of this invention. In this figure, 41 and 42 are buffer amplifier transistors; 11, 26, 43, and 44 are biasing resistors; 32 is a bypass capacitor; 39 and 40 are high-frequency choke coils; 37 and 38 are inter-stage coupling capacitors; 6 and 22 are output coupling capacitors; 34 is a bias voltage supply terminal; and 15 and 16 are high-frequency output terminals. The other components are the same as in FIG. 2. In this case, the inter-stage coupling capacitors 37 and 38 are a sixth and a seventh capacitors, and the output coupling capacitors 6 and 22 are an eighth and a ninth capacitors.

The high-frequency oscillating circuit of this configuration according to the third embodiment operates as follows.

In FIG. 6, the oscillating transistors 1 and 17 constitute a grounded-base clap oscillating circuit and perform oscillating operations by providing oscillating signals the phases of which are mutually shifted through 180°, as in the first embodiment. Their outputs are amplified by the buffer amplifier transistors 41 and 42 via the inter-stage coupling capacitors 37 and 38 and are then obtained from between the high-frequency output terminals 15 and 16 through the output coupling capacitors 6 and 22 as a differential signal output.

The buffer amplifier transistors 41 and 42 are of a grounded-emitter differential-amplifying circuit form. The emitters of the two buffer amplifier transistors are directly connected together.

As described above, the emitter grounding capacitor conventionally connected between the two buffer amplifier transistors is not connected, but the emitter electrodes of the two buffer amplifier transistors are directly connected together to eliminate the grounding capacitor that has an impedance component at a-high frequency in the oscillating circuit and buffer amplifier sections, thereby providing a high-frequency oscillating circuit that does not have its characteristics such as the S/N ratio degraded.

In addition, in a DC bias circuit, the collectors of the oscillating transistors 1 and 17 are connected to the emitters of the buffer amplifier transistors 41 and 42 through the high-frequency chokes 10 and 25, which are a first and a second inductors. Thus, the same collector current path is used for the buffer amplifier transistor 41 and oscillating transistor 1, and the same collector current path is similarly used for the buffer amplifier transistor 42 and oscillating transistor 17.

This configuration provides a high-frequency oscillating circuit that can reduce current consumption compared to a circuit using separate current paths to provide collector currents to the oscillating and buffer amplifier transistors.

(Embodiment 4)

Figure 7:
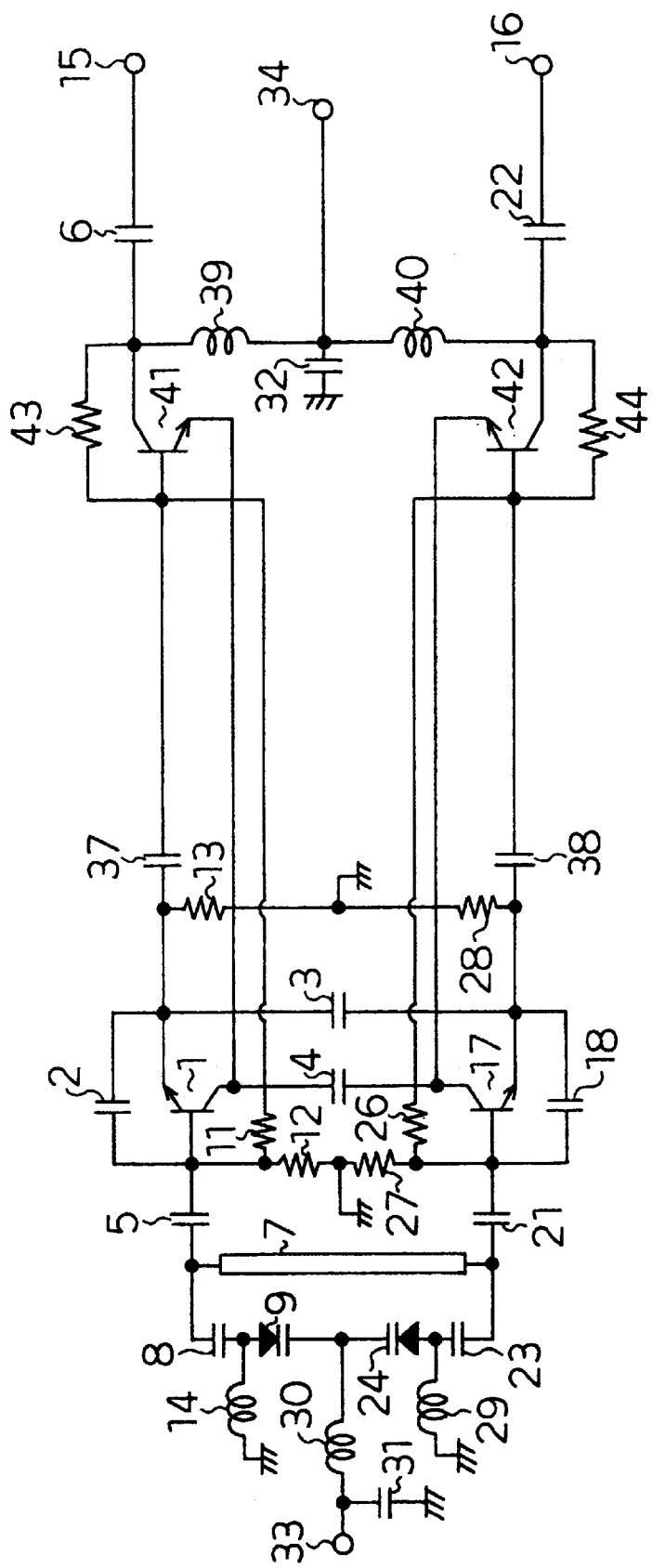
FIG. 7 is a circuit diagram showing a high-frequency oscillating circuit of a fourth embodiment according to this invention.

FIG. 7 is a circuit diagram showing a high-frequency oscillating circuit of a fourth embodiment according to this invention. In this figure, 41 and 42 are buffer amplifier transistors; 43 and 44 are biasing resistors; 32 is a bypass capacitor; 39 and 40 are high-frequency choke coils; 37 and 38 are inter-stage coupling capacitors; 6 and 22 are output coupling capacitors; 34 is a bias voltage supply terminal; and 15 and 16 are high-frequency output terminals. In this case, the oscillating transistor 1 is a first oscillating transistor, the oscillating transistor 17 is a second oscillating transistor, the buffer amplifier transistor 41 is a first buffer amplifier transistor, and the buffer amplifier transistor 42 is a second buffer amplifier transistor. The other components are the same as in FIG. 3.

The high-frequency oscillating circuit of this configuration according to the fourth embodiment operates as follows.

In FIG. 7, the oscillating transistors 1 and 17 constitute a grounded-collector clap oscillating circuit and perform oscillating operations by providing oscillating signals the phases of which are mutually shifted through 180°, as in the second embodiment. Their outputs are amplified by the buffer amplifier transistors 41 and 42 via the inter-stage coupling capacitors 37 and 38 and are then obtained from between the high-frequency output terminals 15 and 16 through the output coupling capacitors 6 and 22 as a differential signal output.

The buffer amplifier transistors 41 and 42 are of a grounded-emitter differential-amplifying circuit form. The capacitor 4 used to ground the collectors of the oscillating transistors 1 and 17 can also be used as the grounding capacitor for the buffer amplifier transistors 41 and 42.

As described above, the emitter grounding capacitor conventionally connected between the buffer amplifier transistor and the ground is not connected to a ground pattern on a mounting circuit board, but is directly connected between the emitter electrodes of the two oscillating transistors. Thus, differential circuit operations with the oscillating circuit and buffer amplifier sections can be performed at a high frequency without the use of the ground pattern on the mounting circuit board, thereby providing a high-frequency oscillating circuit that is not affected by a potential difference occurring in the ground pattern on the mounting circuit board or that does not have its characteristics such as the S/N ratio degraded even if an external electromagnetic interference occurs.

In addition, in a DC bias circuit, the collectors of the oscillating transistors 1 and 17 are connected to the emitters of the buffer amplifier transistors 41 and 42. Thus, the same collector current path is used for the buffer amplifier transistor 41 and oscillating transistor 1, and the same collector current path is similarly used for the buffer amplifier transistor 42 and oscillating transistor 17.

This configuration provides a high-frequency oscillating circuit that can reduce current consumption compared to a circuit using separate current paths to provide collector currents to the oscillating and buffer amplifier transistors.

Figure 8:
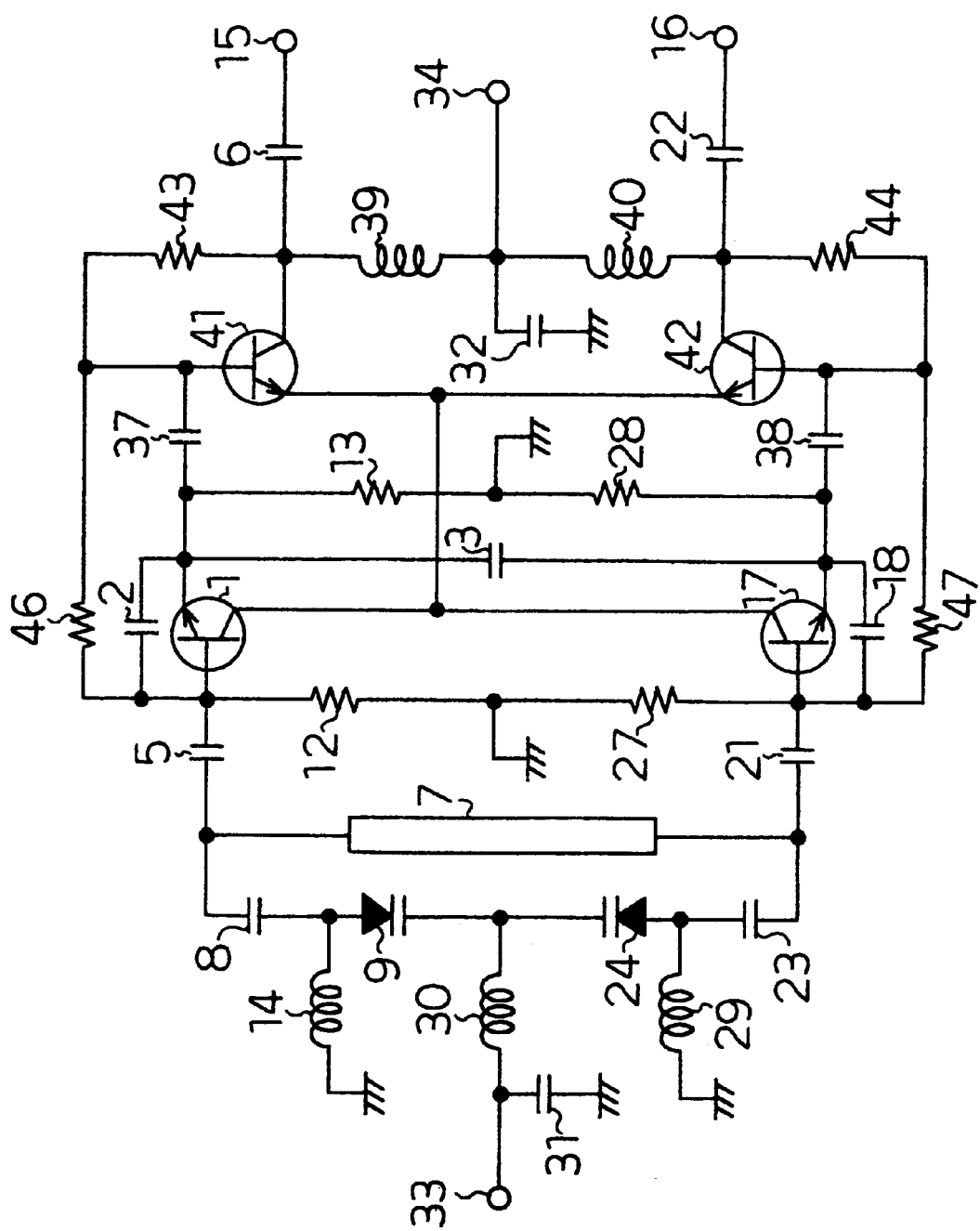
FIG. 8 is a circuit diagram showing another example of a high-frequency oscillating circuit of the fourth embodiment.

FIG. 8 is a circuit diagram showing another example of a high-frequency oscillating circuit according to the fourth embodiment of this invention. In this figure, 41 and 42 are buffer amplifier transistors; 43, 44, 46, and 47 are biasing resistors; 32 is a bypass capacitor; 39 and 40 are high-frequency choke coils; 37 and 38 are inter-stage coupling capacitors; 6 and 22 are output coupling capacitors; 34 is a bias voltage supply terminal; and 15 and 16 are high-frequency output terminals. The other components are the same as in FIG. 4.

The high-frequency oscillating circuit of this configuration according to the fourth embodiment operates as follows.

In FIG. 8, the oscillating transistors 1 and 17 constitute a grounded-collector clap oscillating circuit and perform oscillating operations by providing oscillating signals the phases of which are mutually shifted through 180°, as in the second embodiment. Their outputs are amplified by the buffer amplifier transistors 41 and 42 via the inter-stage coupling capacitors 37 and 38 and are then obtained from between the high-frequency output terminals 15 and 16 through the output coupling capacitors 6 and 22 as a differential signal output.

The buffer amplifier transistors 41 and 42 are of a grounded-emitter differential-amplifying circuit form. The emitters of the two buffer amplifier transistors are directly connected together.

As described above, the emitter grounding capacitor conventionally connected between the two buffer amplifier transistors is not connected, but the emitter electrodes of the two buffer amplifier transistors are directly connected together. Thus, differential circuit operations with the oscillating circuit and buffer amplifier sections can be performed at a high frequency without the use of the grounding capacitor, thereby providing a high-frequency oscillating circuit that does not have its characteristics such as the S/N ratio degraded due to an impedance of the grounding capacitor.

In addition, in a DC bias circuit, the collectors of the oscillating transistors 1 and 17 are connected to the emitters of the buffer amplifier transistors 41 and 42. Thus, the same collector current path is used for the buffer amplifier transistor 41 and oscillating transistor 1, and the same collector current path is similarly used for the buffer amplifier transistor 42 and oscillating transistor 17.

This configuration provides a high-frequency oscillating circuit that can reduce current consumption compared to a circuit using separate current paths to provide collector currents to the oscillating and buffer amplifier transistors.

The configuration of the circuit according to this embodiment is only illustrative, and the configuration of additional circuit around the transistors is not limited to such an aspect as long as the bases or collectors of the two oscillating transistors are directly connected together while the emitters of the two buffer amplifier transistors are directly connected together so as not to be affected by an impedance of the grounding capacitor.

(Embodiment 5)

Figure 9:
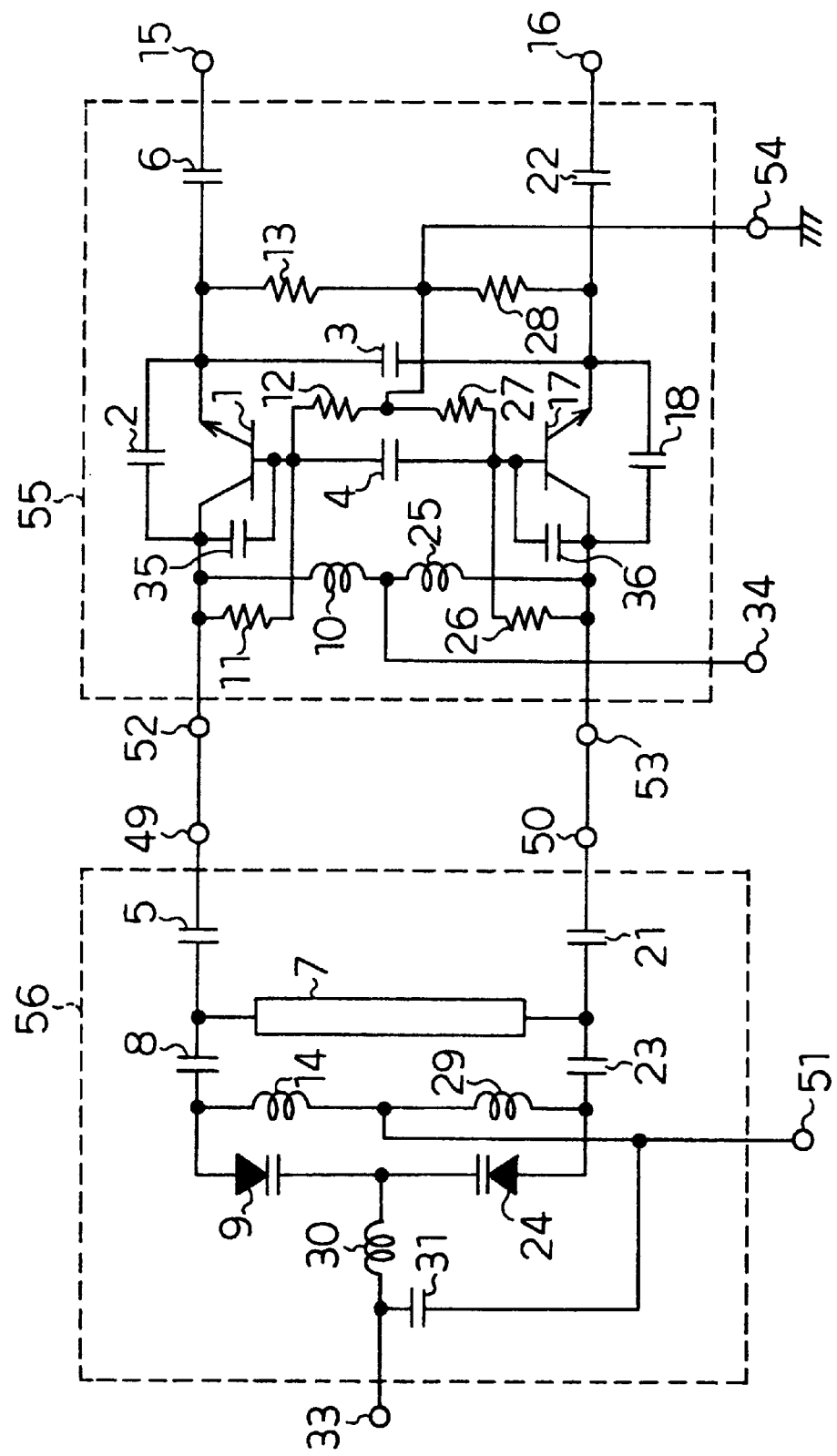
FIG. 9 is a circuit diagram showing a high-frequency oscillating circuit of a fifth embodiment according to this invention.
Figure 17:
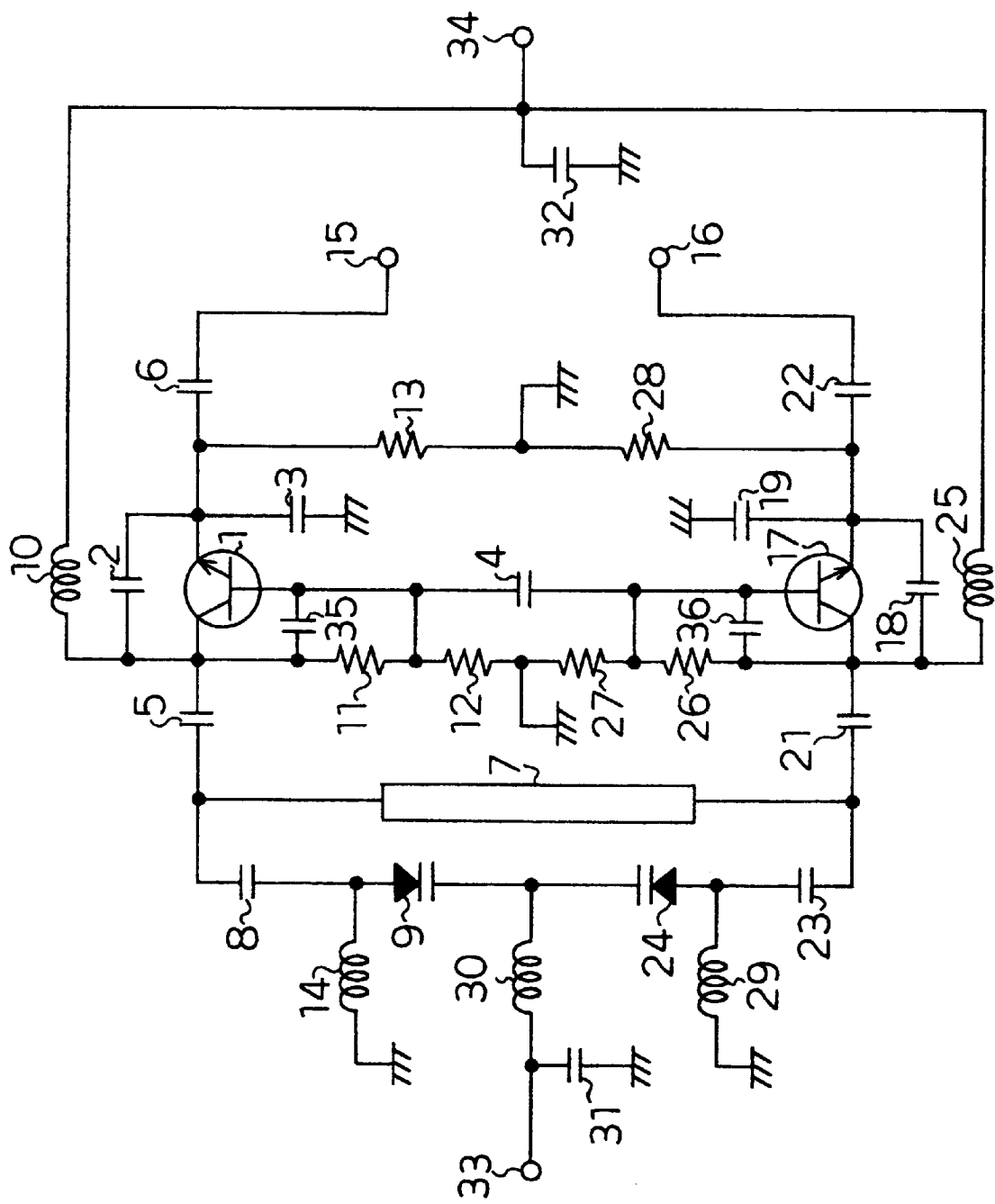
FIG. 17 is a circuit diagram of another example of the high-frequency oscillating circuit according to the first embodiment of this invention.

FIG. 9 is a circuit diagram of a high-frequency circuit showing a fifth embodiment of this invention. According to this embodiment, a resonating circuit 56 and an oscillating circuit 55 are mutually separated and connected. In FIG. 9, 1 and 17 are oscillating transistors as a first and a second oscillating transistors; 2, 35, 4, 18, 36, and 3 are capacitors; 6 and 22 are output coupling capacitors; 11, 12, 13, 26, 27, and 28 are biasing resistors; 15 and 16 are high-frequency output terminals; 10 and 25 are high-frequency chokes; 34 is a bias voltage supply terminal; 54 is a ground terminal; 52 and 53 are connection points to the resonating circuit; and 55 is a negative-resistance-generating integrated circuit as an external circuit for generating negative resistance.

Likewise, in FIG. 9, 5 and 21 are resonator coupling capacitors; 7 is a resonator; 8 and 23 are varactor diode coupling capacitors; 9 and 24 are varactor diodes; 14 and 29 are varactor diode bias chokes; 30 is a high-frequency choke; 31 is a bypass capacitor; 33 is a tuning voltage supply terminal; 51 is a ground terminal; and 56 is a resonating circuit. Connection points 49 and 50 to the negative-resistance-generating integrated circuit which are connected to the capacitors 5 and 21, respectively, are a first and a second connection points.

The oscillating circuit using a resonating circuit of this configuration according to the fifth embodiment of this invention operates as follows.

In FIG. 9, the oscillating transistors 1 and 17 have their base terminals connected together via the capacitor 4 having a sufficiently low impedance in the oscillating frequency band. The capacitors 2 and 18 are connected to the transistors 1 and 17 as collector-to-emitter capacitive elements the values of which are selected to provide an optimal C/N ratio in the oscillating frequency band. The capacitors 35 and 36 are connected to the transistors 1 and 17 as collector-to-base capacitive elements the values of which are selected to provide an optimal C/N ratio in the oscillating frequency band. In addition, the capacitor 3 is connected between the emitters of the transistors 1 and 17 and its element value is selected to provide an optimal C/N ratio in the oscillating frequency band. Furthermore, the resonator 7, which is connected via the resonator coupling capacitors 5 and 21 in the resonating circuit 56, is a half-length resonator with its tip open. Since the middle point of the resonator equivalently acts as a short-circuit point for the ground, the resonator 7 is equivalently connected between the collector and base of the transistor 1 via the resonator coupling capacitor 5 as an inductive element and between the collector and base of the transistor 17 via the capacitor 21 as an inductive element.

In addition, the varactor diodes 9 and 24 are each connected to the resonator 7 via the varactor diode coupling capacitors 8 and 23, respectively. Furthermore, since the anodes of the varactor diodes 9 and 24 are provided with the ground potential by the varactor diode bias chokes 14 and 29 via the ground terminal 51 in a DC manner, the value of a voltage applied to the cathodes of the varactor diodes 9 and 24 from the tuning voltage supply terminal 33 via the high-frequency choke 30 varies the values of the capacity of the varactor diodes 9 and 24 to enable the oscillating frequency to be varied.

Thus, in the circuit in FIG. 9, two grounded-base clap oscillating circuits perform oscillating operations by using one half-length resonator to provide oscillating signals the phases of which are mutually shifted through 180°, and their output is obtained from between the high-frequency output terminals 15 and 16 via the output coupling capacitors 6 and 22 as a differential signal output between the two circuits.

The negative-resistance-generating integrated circuit 55 is formed on a semiconductor chip as an integrated circuit using an IC process.

On the other hand, the resonating circuit 56 is modularized separately from the negative-resistance-generating integrated circuit 55 so as to connect to the connection points 52 and 53 to the resonating circuit in the negative-resistance-generating integrated circuit 55 via the connection points 49 and 50 to the negative-resistance-generating integrated circuit 55.

Thus, in contrast to conventional resonating circuits for oscillating circuit ICs, the resonating circuit according to this embodiment is not arranged on the oscillating circuit IC in which the negative-resistance-generating circuit section is formed but is provided as a separate module. Thus, the resonating circuit can be configured without the degradation of the Q factor to provide a high C/N ratio for the oscillating circuit IC.

In addition, when the negative-resistance-generating integrated circuit 55 is configured as described above, the base grounding capacitor and emitter-to-ground capacitor conventionally connected between the oscillating transistor and the ground are not connected to a ground pattern on a circuit board on which the negative-resistance-generating circuit is mounted, but are directly connected between the base electrodes and emitter electrodes of the two oscillating transistors. Thus, differential oscillating operations can be performed at a high frequency without the use of the ground pattern on the mounting circuit board, so a high-frequency oscillating circuit can be provided that is not affected by a potential difference occurring in the ground pattern on the mounting circuit board or that does not have its characteristics such as the S/N ratio degraded even if an external electromagnetic interference occurs.

The external negative-resistance-generating circuit is not limited to the configuration in FIG. 9 as long as it is formed inside the integrated circuit.

(Embodiment 6)

Figure 10:
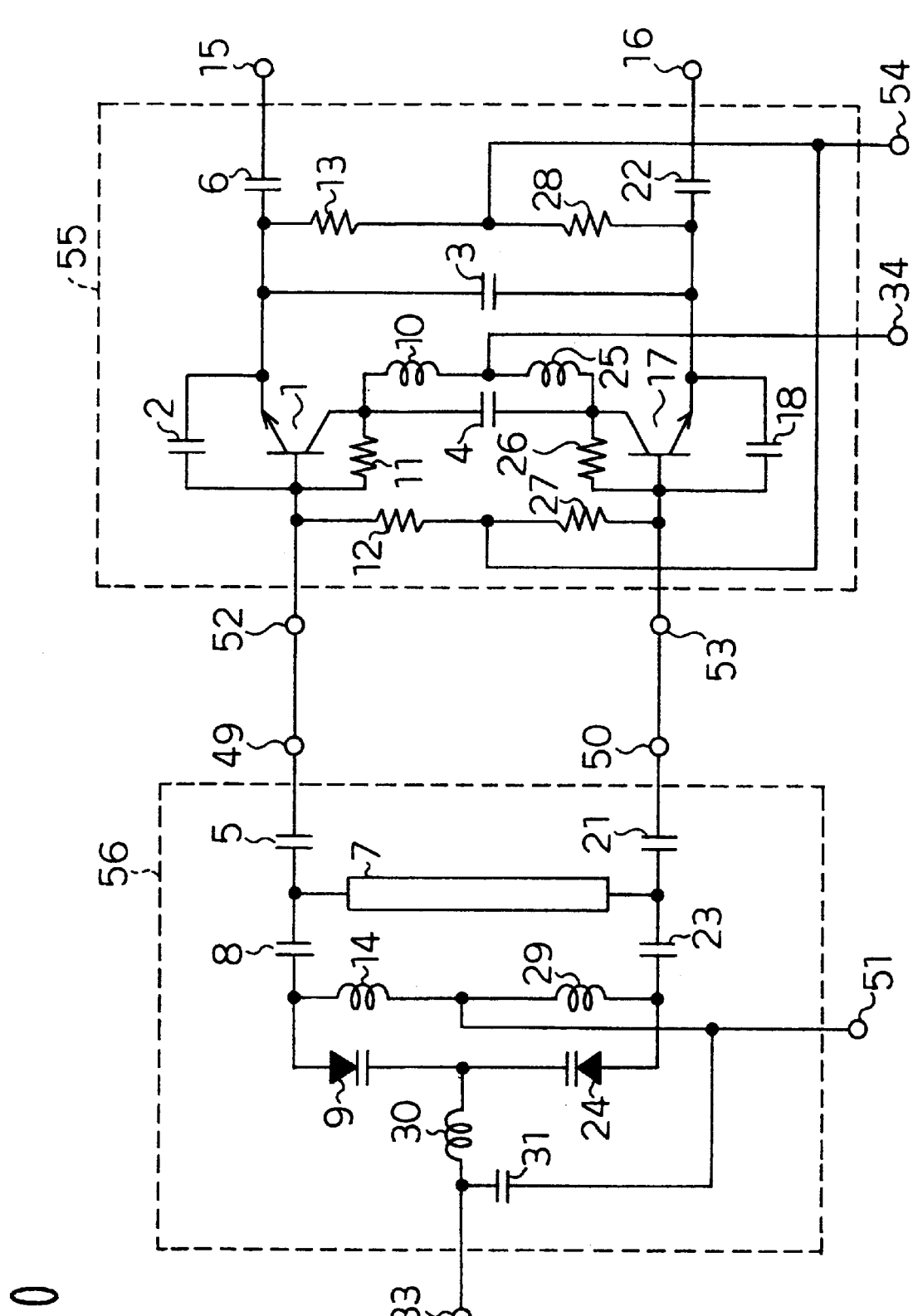
FIG. 10 is a circuit diagram showing a high-frequency oscillating circuit of a sixth embodiment according to this invention.

FIG. 10 is a circuit diagram of an oscillating circuit using a resonating circuit showing a sixth embodiment of this invention. In this figure, 1 and 17 are oscillating transistors as a first and a second oscillating transistors; 2, 4, 18, and 3 are capacitors; 6 and 22 are output coupling capacitors; 11, 12, 13, 26, 27, and 28 are biasing resistors; 15 and 16 are high-frequency output terminals; 10 and 25 are high-frequency chokes; 34 is a bias voltage supply terminal; 54 is a ground terminal; 52 and 53 are connection points to the resonating circuit; and 55 is a negative-resistance-generating integrated circuit.

Likewise, in FIG. 10, 56 is a resonating circuit having the same configuration as the resonating circuit according to the first embodiment described above.

The oscillating circuit using a resonating circuit of this configuration according to the sixth embodiment of the invention operates as follows.

In FIG. 10, the oscillating transistors 1 and 17 have their collector terminals connected together via the capacitor 4 having a sufficiently low impedance in the oscillating frequency band. The capacitors 2 and 18 are connected to the transistors 1 and 17 as base-to-emitter capacitive elements the values of which are selected to provide an optimal C/N ratio in the oscillating frequency band. In addition, the capacitor 3 is connected between the emitters of the transistors 1 and 17 and its element value is selected to provide an optimal C/N ratio in the oscillating frequency band. Furthermore, the resonator 7, which is connected via the resonator coupling capacitors 5 and 21 in the resonating circuit 56, is a half-length resonator with its tip open. Since the middle point of the resonator equivalently acts as a short-circuit point for the ground, the resonator 7 is equivalently connected between the collector and base of the transistor 1 via the resonator coupling capacitor 5 as an inductive element and between the ,collector and base of the transistor 17 via the capacitor 21 as an inductive element.

In addition, the varactor diodes 9 and 24 are each connected to the resonator 7 via the varactor diode coupling capacitors 8 and 23, respectively. Furthermore, since the anodes of the varactor diodes 9 and 24 are provided with the ground potential by the varactor diode bias chokes 14 and 29 via the ground terminal 51 in a DC manner, the value of a voltage applied to the cathodes of the varactor diodes 9 and 24 from the tuning voltage supply terminal 33 via the high-frequency choke 30 varies the values of the capacity of the varactor diodes 9 and 24 to enable the oscillating frequency to be varied.

Thus, in the circuit in FIG. 10, two grounded-collector clap oscillating circuits perform oscillating operations by using one half-length resonator to provide oscillating signals the phases of which are mutually shifted through 180°, and their output is obtained from between the high-frequency output terminals 15 and 16 via the output coupling capacitors 6 and 22 as a differential signal output between the two circuits.

The negative-resistance-generating integrated circuit 55 is formed on a semiconductor chip as an integrated circuit using an IC process.

On the other hand, the resonating circuit 56 is modularized separately from the negative-resistance-generating integrated circuit 55 so as to connect to the connection points 52 and 53 to the resonating circuit in the negative-resistance-generating integrated circuit 55 via the connection points 49 and 50 to the negative-resistance-generating integrated circuit 55.

Thus, in contrast to conventional resonating circuits for oscillating circuit ICs, the resonating circuit according to this embodiment is not arranged on the oscillating circuit IC in which the negative-resistance-generating circuit section is formed but is provided as a separate module, as in the first embodiment of this invention. Thus, the resonating circuit can be configured without the degradation of the Q factor to provide a high C/N ratio for the oscillating circuit IC.

In addition, when the negative-resistance-generating integrated circuit 55 is configured as described above, the collector grounding capacitor and emitter-to-ground capacitor conventionally connected between the oscillating transistor and the ground are not connected to a ground pattern on a circuit board on which the negative-resistance-generating circuit is mounted, but are directly connected between the collector electrodes and emitter electrodes of the two oscillating transistors. Thus, differential oscillating operations can be performed at a high frequency without the use of the ground pattern on the mounting circuit board, so a high-frequency oscillating circuit can be provided that is not affected by a potential difference occurring in the ground pattern on the mounting circuit board or that does not have its characteristics such as the S/N ratio degraded even if an external electromagnetic interference occurs.

The negative-resistance-generating circuit 55 that is the external negative-resistance-generating circuit is not limited to the configuration in FIG. 10 as long as it is formed inside the integrated circuit.

Figure 11:
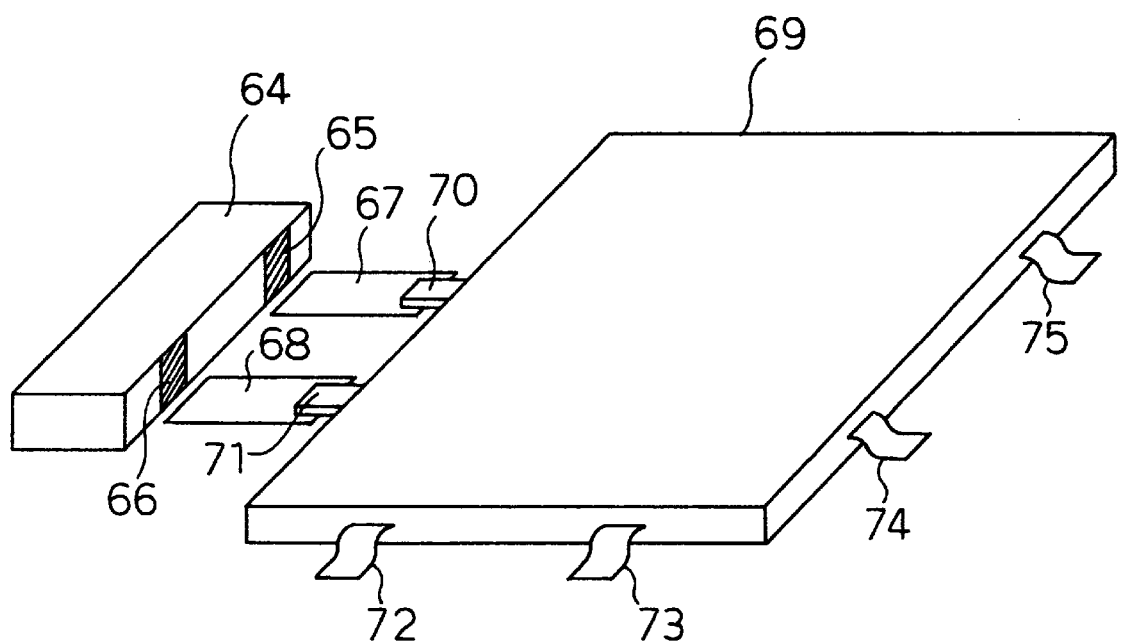
FIG. 11 shows a configuration of the high-frequency oscillating circuits in the fifth and sixth embodiments of this invention.

FIG. 11 shows a configuration of an oscillating circuit that uses a resonating circuit according to the fifth and a sixth embodiments. In this figure, 69 is an IC package including the negative-resistance-generating integrated circuit 55 according to the fifth and sixth embodiments.

Reference numerals 70 to 75 designate IC package connection terminals that are connected inside the IC package 69 to the connection points 52 and 53 of the negative-resistance-generating integrated circuit 55 according to the fifth and sixth embodiments connecting to the resonating circuit and that are also connected to the bias voltage supply terminal 34, the ground terminal 54, and the high-frequency output terminals 15 and 16.

Reference numeral 64 designates a resonating circuit module formed of the resonating circuit 56 according to the fifth and sixth embodiments. Sides 65 and 66 of the resonating circuit 56 are terminal electrodes composed of the connection points 49 and 50 of the resonating circuit 56 according to the fifth and sixth embodiments connecting to the negative-resistance-generating integrated circuit.

Reference numerals 67 and 68 denote connection patterns connecting the negative-resistance-generating integrated circuit in the IC package 69 to the resonating circuit forming the resonating circuit module 64 in order to constitute an oscillating circuit.

For example, the resonating circuit module 64 is realized by a strip line resonator formed on a dielectric substrate, a capacitor comprising coupling capacity between conductive patterns formed inside the dielectric substrate in the upper and lower parts thereof, or an inductor comprising a conductive pattern formed on the dielectric substrate. In this case, it is desirable that the dielectric substrate have a high Q factor and be formed of a laminated green sheet of a high dielectric constant using a lamination process, in order to provide excellent characteristics and a small size. The varactor diodes 9 and 24 are mounted in the dielectric substrate as bare, chips.

The above configuration allows the resonating circuit to be realized as a small resonating circuit module having a high Q factor, which is connected to an external circuit mounted in an IC package only with the negative-resistance-generating circuit section configured as an IC to provide a small oscillating circuit having a high total C/N ratio.

(Embodiment 7)

Figure 12:
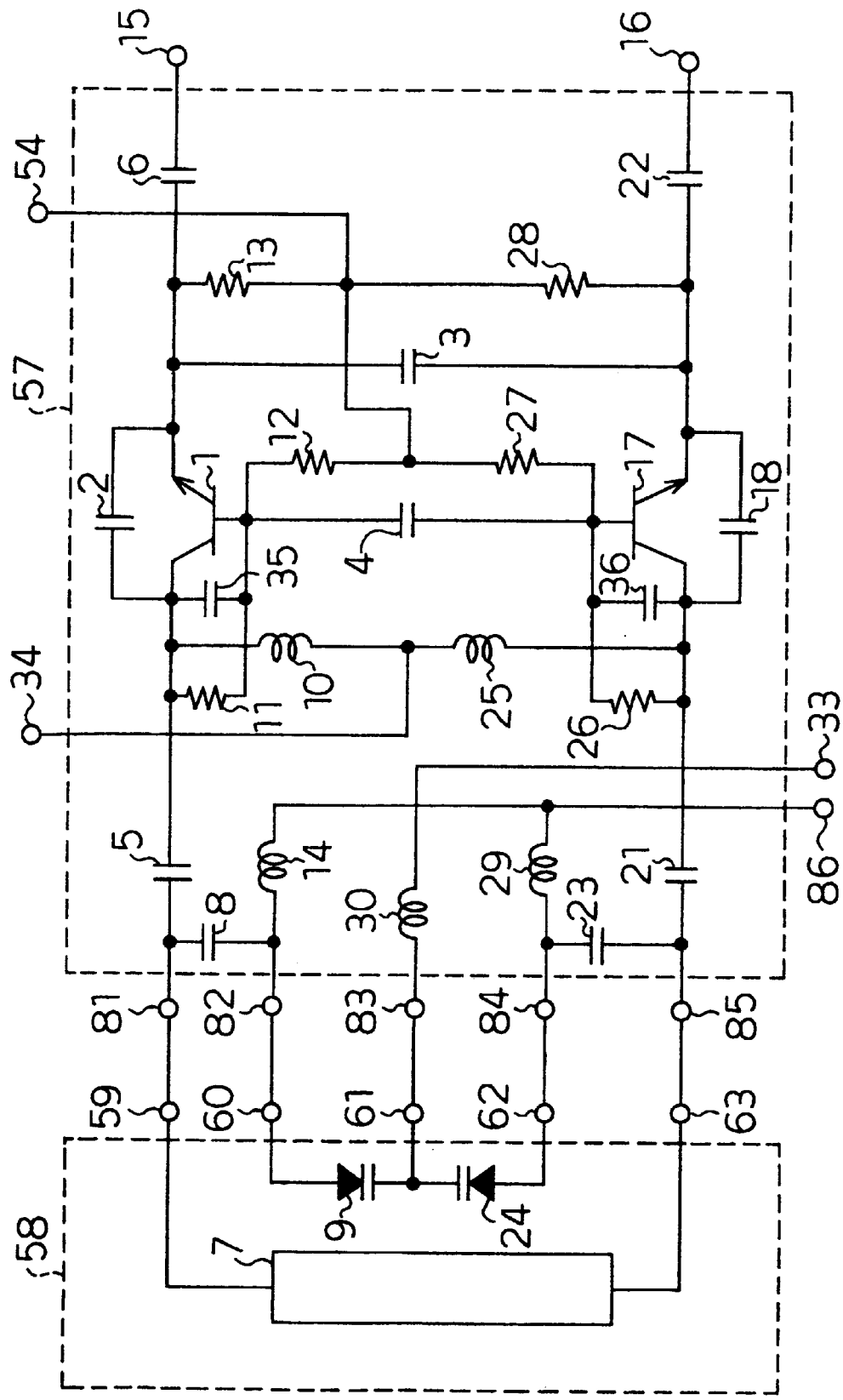
FIG. 12 is a circuit diagram of a high-frequency oscillating circuit according to a seventh embodiment of this invention.

FIG. 12 is a circuit diagram of an oscillating circuit with a resonating circuit showing a seventh embodiment of this invention. In this figure, 1 and 17 are oscillating transistors as a first and a second oscillating transistors; 2, 35, 4, 18, 36, and 3 are capacitors; 6 and 22 are output coupling capacitors; 11, 12, 13, 26, 27, and 28 are biasing resistors; 15 and 16 are high-frequency output terminals; 10 and 25 are high-frequency chokes; 34 is a bias voltage supply terminal; 54 is a ground terminal; 5 and 21 are resonator coupling capacitors; 8 and 23 are varactor diode coupling capacitors; 14 and 29 are varactor diode bias chokes; 30 is a high-frequency choke; 33 is a tuning voltage supply terminal; 86 is a ground terminal; 81, 82, 83, 84, and 85 are connection points to the resonating circuit; and 57 is a negative-resistance-generating integrated circuit as an external circuit for generating negative resistance.

Likewise, in FIG. 12, 7 is a resonator; 9 and 24 are varactor diodes; 59, 60, 61, 62, and 63 are a first, a third, a fourth, a fifth, and a second connection points to the negative-resistance-generating integrated circuit; and 58 is a resonating circuit.

Connection points 81, 82, 83, 84, and 85 of the negative-resistance-generating integrated circuit 57 connecting to the resonating circuit are connected to connection points 59, 60, 61, 62, and 63, respectively, of the resonating circuit 58 connecting to the negative-resistance-generating integrated circuit.

The operation of an oscillating circuit using the resonating circuit of the above configuration according to the seventh embodiment is exactly the same as that in the fifth embodiment of this invention, so its description is omitted.

The seventh embodiment differs from the fifth embodiment in that the resonating circuit 58 arranged outside the negative-resistance-generating circuit 57 integrated using an IC process is composed of only the resonator 7 and varactor diodes 9 and 24.

This is because if the component elements of the resonating circuit 56 according to the fifth embodiment I shown in FIG. 9 are formed using an IC process, the degradation of the Q factor of the resonator 7 and varactor diodes 9 and 24 significantly affects the Q factor of the resonating circuit.

Thus, unlike the conventional resonating circuits for oscillating circuit ICs, the resonating circuit according to this embodiment is not arranged on an oscillating circuit IC in which the negative-resistance-generating circuit section is formed. In addition, in forming elements using an IC process, the resonator and the varactor diodes that is particularly affected by the degradation of the Q factor is provided as a module separate from the negative-resistance-generating circuit. As a result, the resonating circuit can be configured so as to avoid the degradation of the Q factor, thereby achieving a high C/N ratio for the oscillating circuit IC.

In addition, by configuring the negative-resistance-generating integrated circuit 57 as described above, the base grounding capacitor and emitter-to-ground capacitor conventionally connected between the oscillating transistor and the ground are not connected to a ground pattern on a circuit board on which the negative-resistance-generating circuit is mounted, but are directly connected between the base electrodes and emitter electrodes of the two oscillating transistors. Thus, differential oscillating operations can be performed at a high frequency without the use of the ground pattern on the mounting circuit board, so a high-frequency oscillating circuit can be provided that is not affected by a potential difference occurring in the ground pattern on the mounting circuit board or that does not have its characteristics such as the S/N ratio degraded even if an external electromagnetic interference occurs, as in the first embodiment.

The external negative-resistance-generating circuit is not limited to the configuration in FIG. 12 as long as it is formed inside the integrated circuit.

(Embodiment 8)

Figure 13:
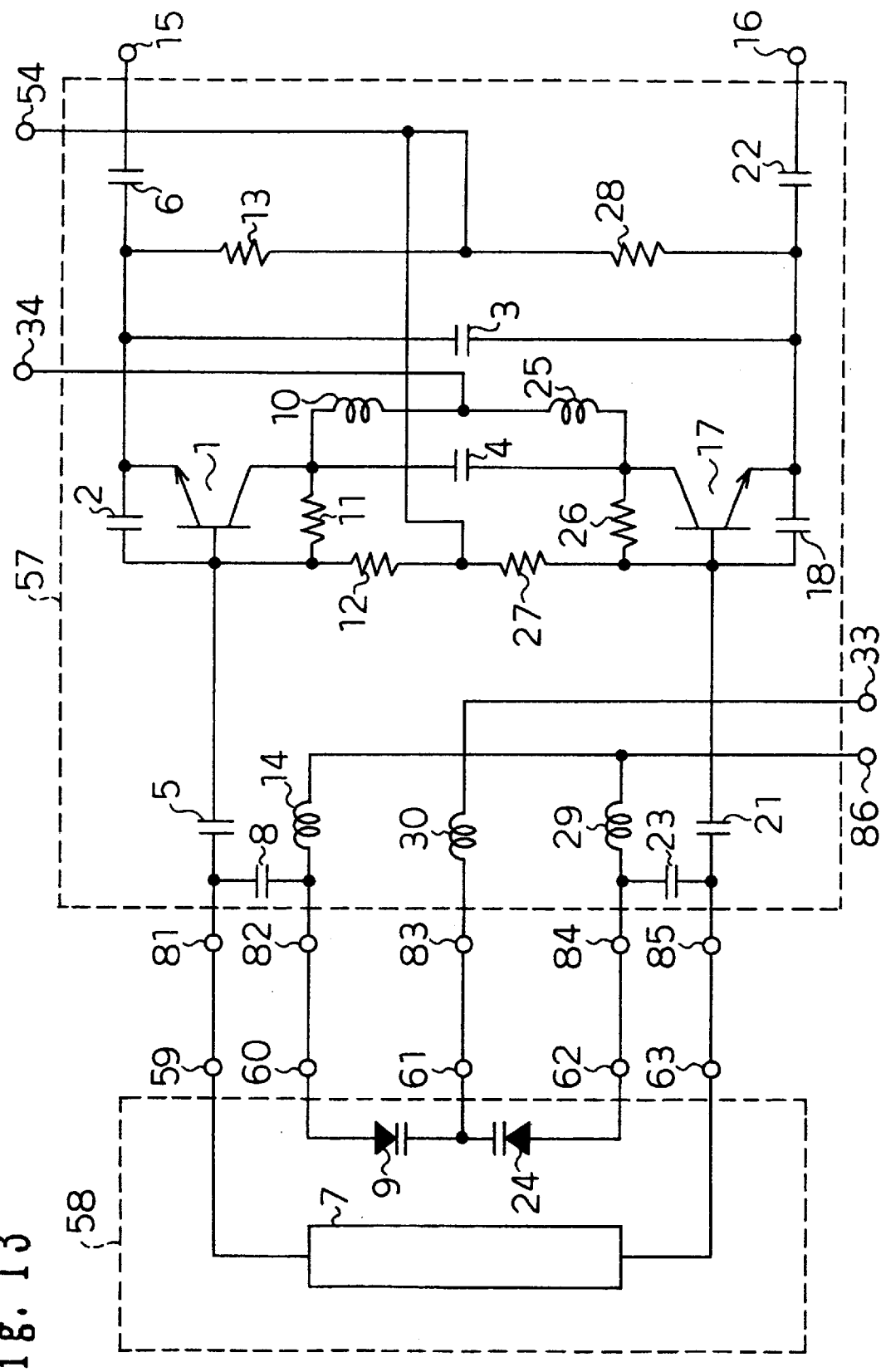
FIG. 13 is a circuit diagram of a high-frequency oscillating circuit according to an eighth embodiment of this invention.

FIG. 13 is a circuit diagram of an oscillating circuit with a resonating circuit showing an eighth embodiment of this invention. In this figure, 1 and 17 are oscillating transistors as a first and a second oscillating transistors; 2, 4, 18, and 3 are capacitors; 6 and 22 are output coupling capacitors; 11, 12, 13, 26, 27, and 28 are biasing resistors; 15 and 16 are high-frequency output terminals; 10 and 25 are high-frequency chokes; 34 is a bias voltage supply terminal; 54 is a ground terminal; 5 and 21 are resonator coupling capacitors; 8 and 23 are varactor diode coupling capacitors; 14 and 29 are varactor diode bias chokes; 30 is a high-frequency choke; 33 is a tuning voltage supply terminal; 86 is a ground terminal; 81, 82, 83, 84, and 85 are connection points to the resonating circuit; and 57 is a negative-resistance-generating integrated circuit.

Likewise, in FIG. 13, 7 is a resonator; 9 and 24 are varactor diodes; 59, 60, 61, 62, and 63 are a first, a third, a fourth, a fifth, and a second connection points to the negative-resistance-generating integrated circuit; and 58 is a resonating circuit.

Connection points 81, 82, 83, 84, and 85 of the negative-resistance-generating integrated circuit 57 connecting to the resonating circuit are connected to connection points 59, 60, 61, 62, and 63, respectively, of the resonating circuit 58 connecting to the negative-resistance-generating integrated circuit.

The operation of an oscillating circuit using the resonating circuit of the above configuration according to the eighth embodiment is exactly the same as that in the sixth embodiment of this invention, so its description is omitted.

The eighth embodiment differs from the sixth embodiment in that the resonating circuit 58 arranged outside the negative-resistance-generating circuit 57 integrated using an IC process is composed of only the resonator 7 and varactor diodes 9 and 24.

As in the resonating circuit 58 in the seventh embodiment, this is because if the component elements of the resonating circuit 56 according to the sixth embodiment shown in FIG. 10 are formed using an IC process, the degradation of the Q factor of the resonator 7 and varactor diodes 9 and 24 significantlyaffects the Q factor of the resonating circuit.

Thus, unlike the conventional resonating circuits for oscillating circuit ICs, the resonating circuit according to this embodiment is not arranged on an oscillating circuit IC in which the negative-resistance-generating circuit section is formed. In addition, in forming elements using an IC process, the resonator and the varactor diodes that is particularly affected by the degradation of the Q factor is provided as a module separate from the negative-resistance-generating circuit. As a result, the resonating circuit can be configured so as to avoid the degradation of the Q factor, thereby achieving a high C/N ratio for the oscillating circuit IC.

In addition, by configuring the negative-resistance-generating integrated circuit 57 as described above, the collector grounding capacitor and emitter-to-ground capacitor conventionally connected between the oscillating transistor and the ground are not connected to a ground pattern on a circuit board on which the negative-resistance-generating circuit is mounted, but are directly connected between the collector electrodes and emitter electrodes of the two oscillating transistors. Thus, differential oscillating operations can be performed at a high frequency without the use of the ground pattern on the mounting circuit board, so a high-frequency oscillating circuit can be provided that is not affected by a potential difference occurring in the ground pattern on the mounting circuit board or that does not have its characteristics such as the S/N ratio degraded even if an external electromagnetic interference occurs, as in the sixth embodiment.

The negative-resistance-generating circuit 57 that is an external negative-resistance-generating circuit is not limited to the configuration in FIG. 13 as long as it is formed inside the integrated circuit.

Figure 14:
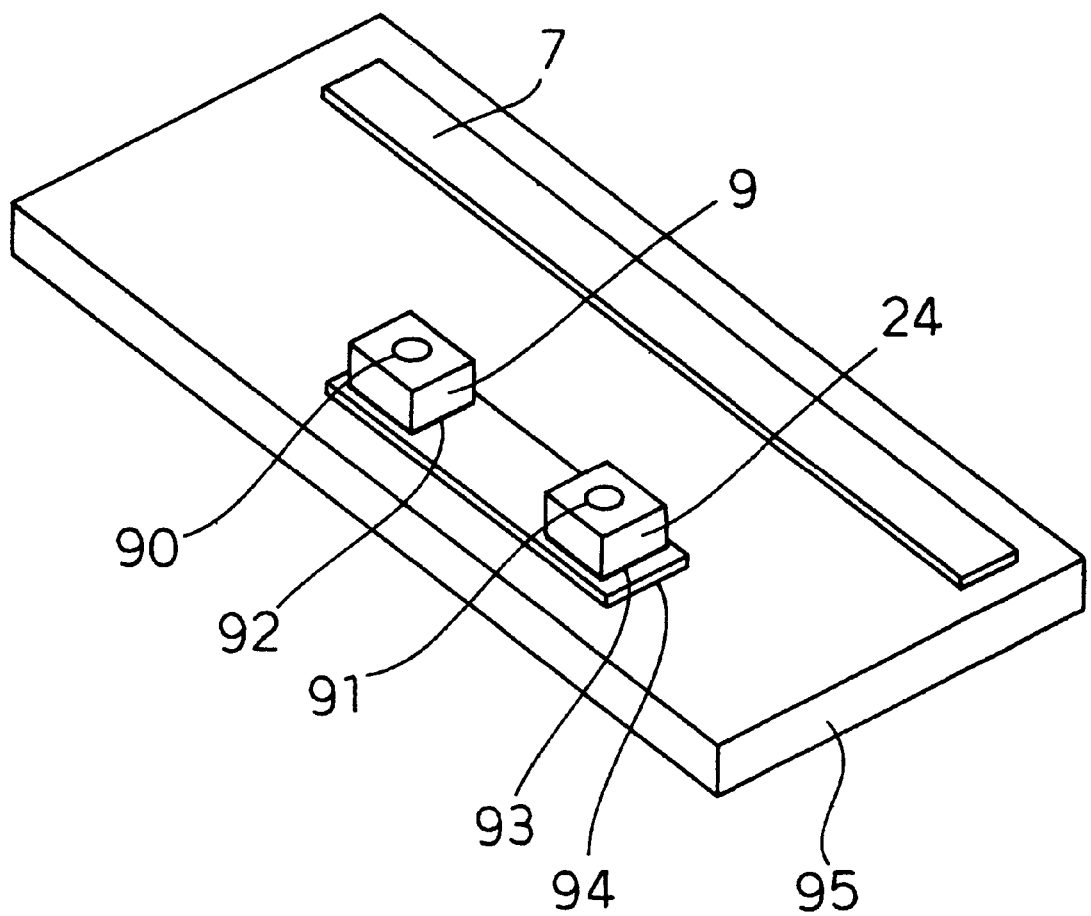
FIG. 14 shows a configuration of resonating circuits in the seventh and eighth embodiments of this invention.

FIG. 14 shows a configuration of a resonating circuit showing the seventh and eighth embodiments of this invention. In this figure, 95 is a dielectric substrate; and 7 is a resonator that is formed of a strip line on the dielectric substrate 95 and that is as long as half the wavelength.

Reference numerals 9 and 24 are varactor diodes (bare chips) wherein varactor diode anode terminals 90 and 91 are formed on the front surface of the chip while varactor diode cathode terminals 92 and 93 are formed on the rear surface of the chip.

The varactor diode cathode terminals 92 and 93 of the two varactor diodes 9 and 24 are connected via a cathode terminal connection pattern 94 which is conductor patterns formed on the dielectric substrate 95. The dielectric substrate is desirably formed of a ceramic substrate or glass having a high Q factor and a high dielectric constant in order to provide excellent characteristics and a small size.

Figure 15:
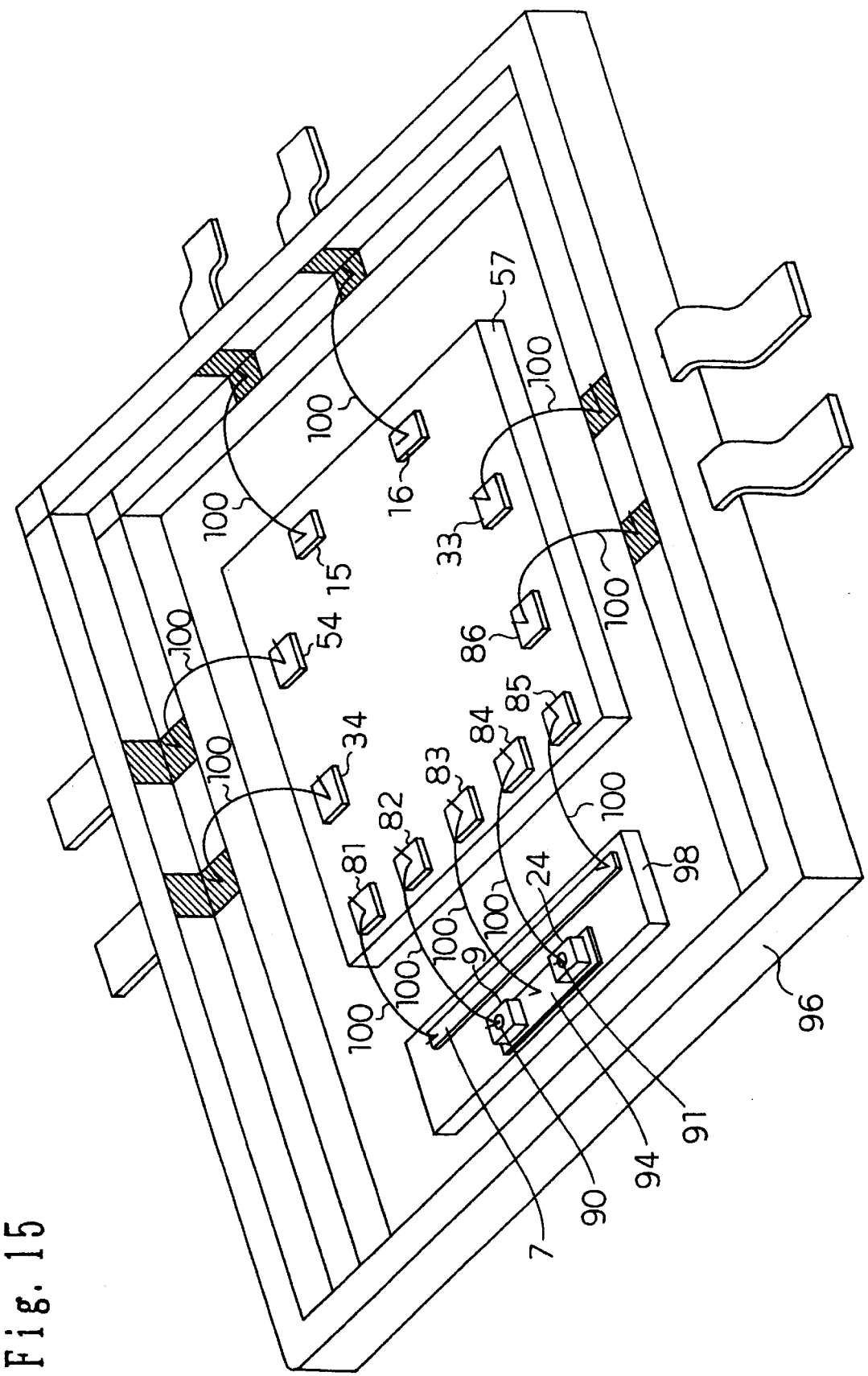
FIG. 15 shows a configuration of an example of the high-frequency oscillating circuits in the seventh and eighth embodiments of this invention.

FIG. 15 shows a configuration of an example of an oscillating circuit using a resonating circuit, showing the seventh and eighth embodiments of this invention. In this figure, 57 is a negative-resistance-generating integrated circuit; 15 and 16 are high-frequency output terminals; 33 is a tuning voltage supply terminal; 34 is a bias voltage supply terminal; 54 and 86 are ground terminals; 81 to 85 are connection points to the resonating circuit; 98 is a resonating circuit module; 7 is a resonator; 9 and 24 are varactor diodes; 90 and 91 are varactor diode anode terminals; 94 is a cathode terminal connection pattern; 100 is a bonding wire, and 96 is an IC package.

The connection points 81 to 85 to the resonating circuit in FIG. 15 are formed as bonding pads on an IC, have the same reference numerals as in FIGS. 12 and 13 that are circuit diagrams representing the seventh and eighth embodiments, and are connected to the resonating circuit module 98 via the bonding wire 100 so as to match the circuit diagrams shown in FIGS. 12 and 13.

In addition, the resonating circuit module 98 and negative-resistance-generating integrated circuit 57 are mounted in the IC package, as shown in the figure. In this case, however, the resonating circuit section is also formed as the resonating circuit module 98 arranged on the dielectric substrate as shown in FIG. 14 and is connected to the negative-resistance-generating integrated circuit 57 that is an external circuit in order to constitute an oscillating circuit.

The above configuration allows the resonating circuit to be realized as a small resonating circuit module having a high Q factor, which is mounted in an IC package with the negative-resistance-generating circuit section configured as an IC to provide a small oscillating circuit having a high total C/N ratio.

Figure 16:
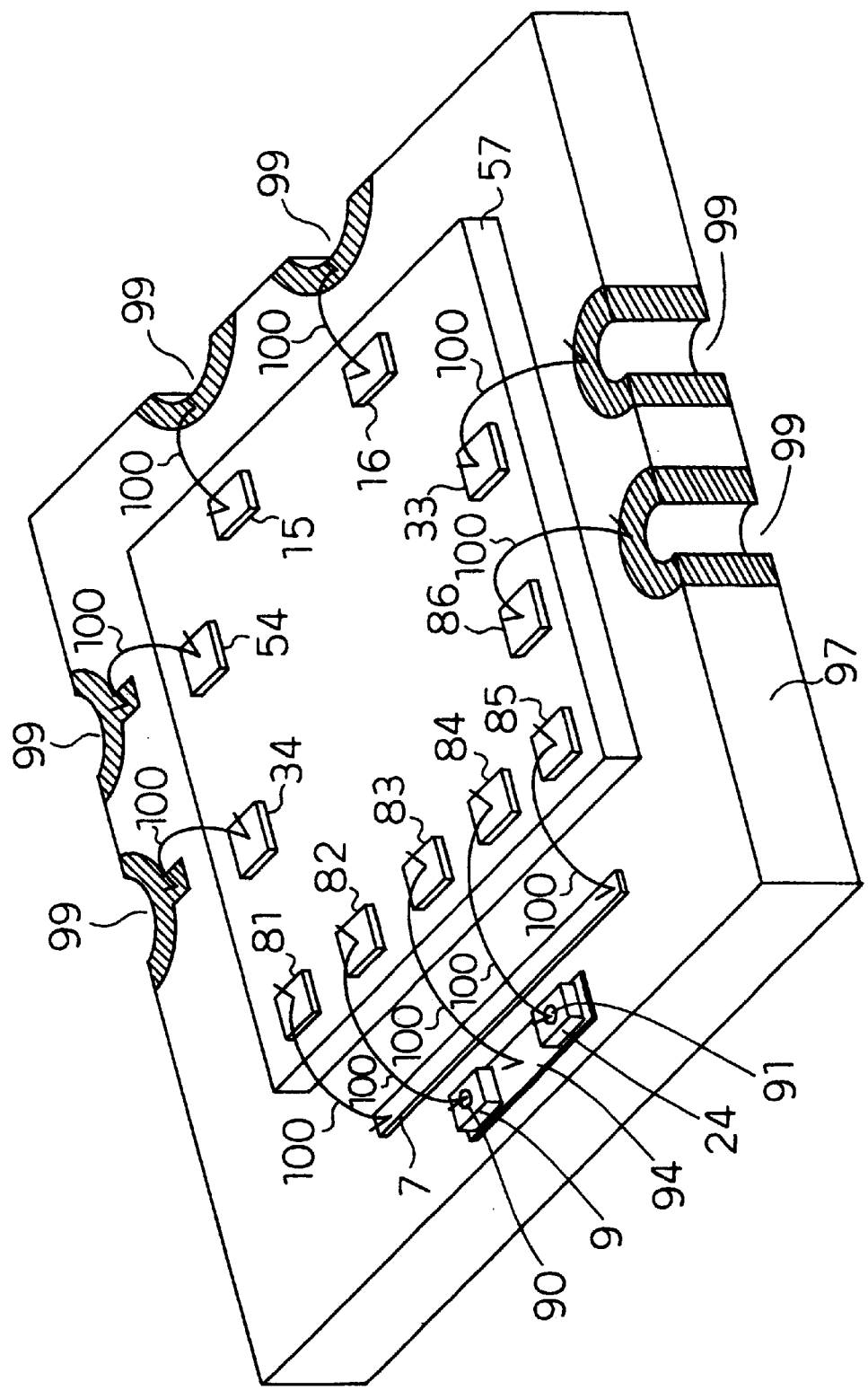
FIG. 16 shows a configuration of another example of the high-frequency oscillating circuits in the seventh and eighth embodiments of this invention.

Furthermore, FIG. 16 shows a configuration of another example of an oscillating circuit using a resonating circuit, showing the seventh and eighth embodiments of this invention. In this figure, 57 is a negative-resistance-generating integrated circuit; 15 and 16 are high-frequency output terminals; 33 is a tuning voltage supply terminal; 34 is a bias voltage supply terminal; 54 and 86 are ground terminals; 81 to 85 are connection points to the resonating circuit; 7 is a resonator; 9 and 24 are varactor diodes; 90 and 91 are varactor diode anode terminals; 94 is a cathode terminal connection pattern; 100 is a bonding wire; 97 is a dielectric substrate; and 99 is a terminal electrode.

In FIG. 16, the dielectric substrate 97 includes a terminal electrode 99 gold-plated on its sides and top surface and having pads that can be bonded.

In addition, the resonator 7 that is as long as half the wavelength and that has its tip open is formed as a strip line resonator on the dielectric substrate 97, and the cathode terminal connection pattern 94 of the varactor diode is also formed of a conductor pattern on the dielectric substrate 97.

The varactor diodes 9 and 24 are mounted on the cathode terminal connection pattern 94 by, for example, bare chips. The negative-resistance-generating integrated circuit 57 is mounted on the dielectric subtrate 97.

The connection points 81 to 85 to the resonating circuit in FIG. 16 are formed as bonding pads on an IC, have the same reference numerals as in FIGS. 12 and 13 that are circuit diagrams representing the seventh and eighth embodiments of the invention, and are connected to the resonator 7 and varactor diode anodes 90 and 91 via the bonding wire 100 so as to match the circuit diagrams shown in FIGS. 12 and 13, thereby constituting an oscillating circuit.

In addition, as shown in the figure, the high-frequency output terminals 15 and 16, tuning voltage supply terminal 33, bias voltage supply terminal 34, and ground terminals 54 and 86 are connected to the terminal electrodes 99 formed on the dielectric substrate 97.

In this case, to protect the elements, the dielectric substrate, the negative-resistance-generating integrated circuit chip mounted on the dielectric substrate, and the varactor diode chip are desirably covered with a sealant.

The above configuration allows the resonating circuit to be realized as a resonating circuit module having a high Q factor, and a negative-resistance-generating circuit chip configured as an IC can then be mounted on the dielectric substrate constituting the resonating circuit, thereby providing a small oscillating circuit having a high total C/N ratio.

As described above, although the conventional techniques configure the oscillating circuit as an IC together with the resonating circuit section for the oscillating circuit, this invention integrates together the resonator, varactor diodes, capacitors, and chokes constituting the resonating circuit section, as a module separate from the negative-resistance-generating circuit configured as an IC and including oscillating transistors. Thus, for example, the resonator is formed of a strip conductor on the dielectric substrate to provide a high Q factor, and instead of the IC process, conventional unitary discrete elements can be used for the varactor diodes to also increase the Q factor and volume ratio, thereby realizing a resonating circuit with a high Q factor. Thus, a combination with the oscillating circuit IC can provide an oscillating circuit IC having a high C/N ratio.

In the fifth to eighth embodiments, the resonating circuit is configured as shown in FIGS. 1 and 2 or FIGS. 4 and 5, but as long as it includes a resonator and two varactor diodes, the other elements such as capacitors and coils to be included are not limited. In this case, the elements that are not included in the resonating circuit may be included in the negative-resistance-generating circuit.

Figure 18:
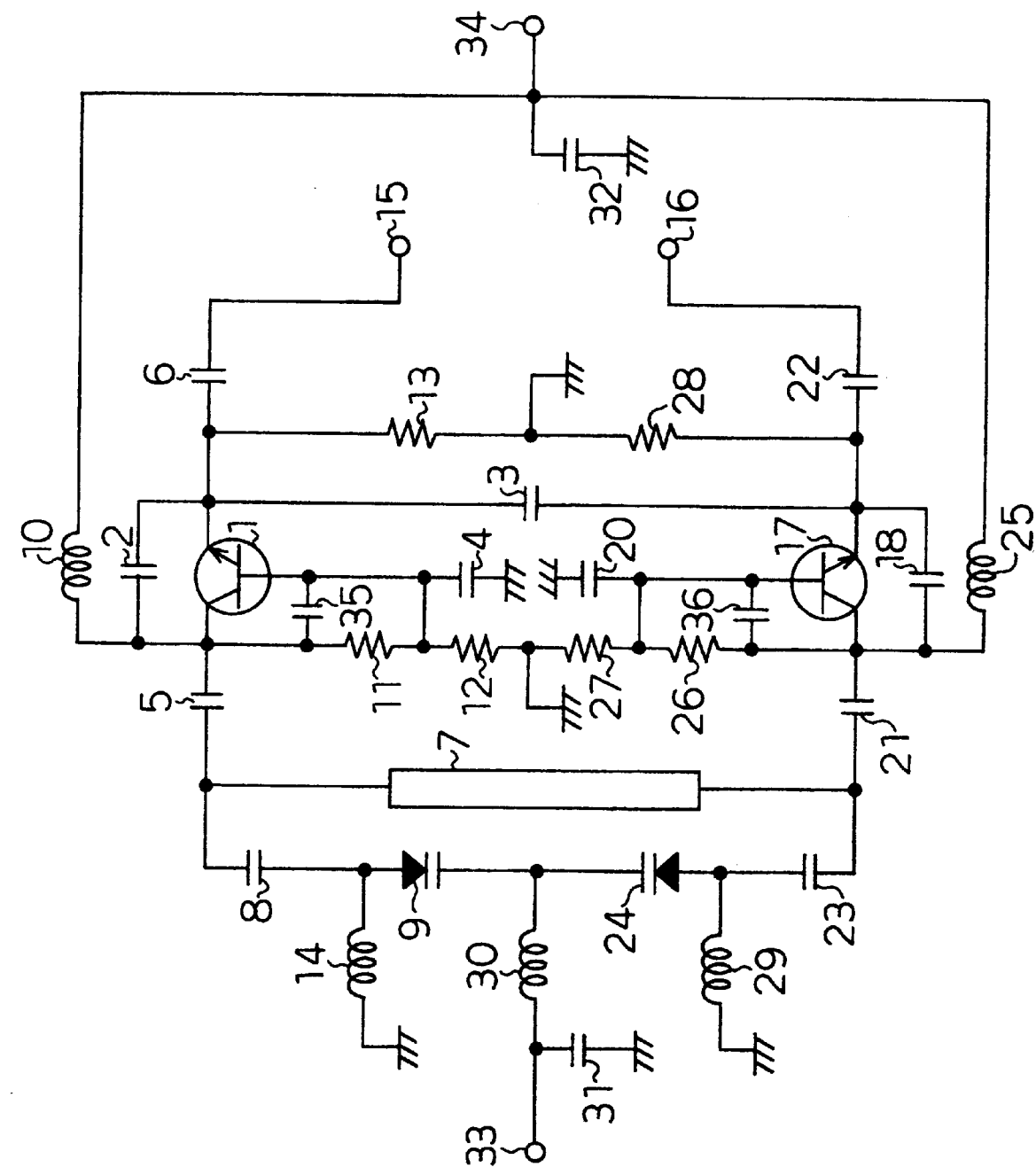
FIG. 18 is a circuit diagram of yet another example of the high-frequency oscillating circuit according to the first embodiment of this invention.
Figure 19:
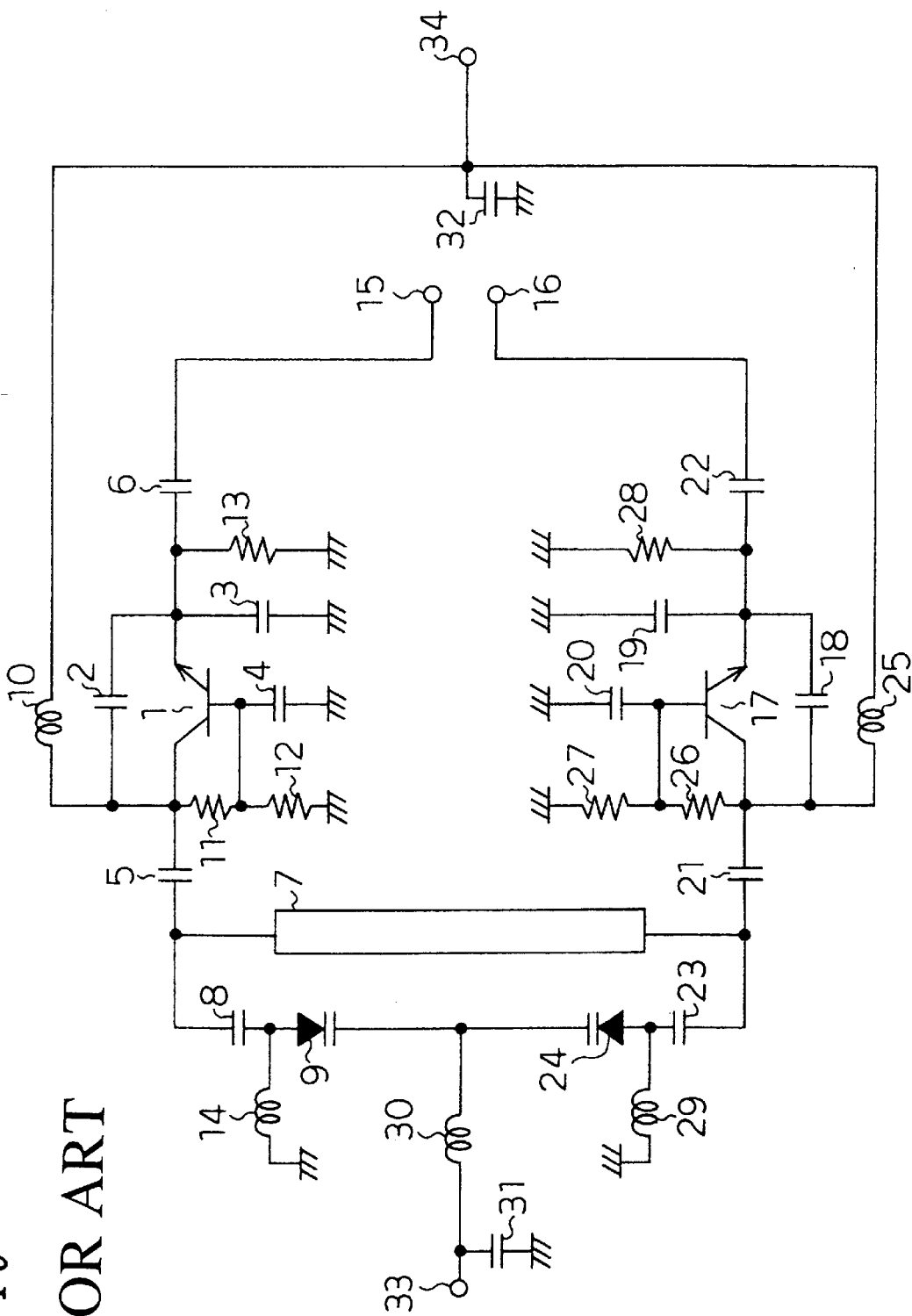
FIG. 19 is a circuit diagram showing a conventional high-frequency oscillating circuit.

Although the first embodiment directly connects both bases and both emitters of the two oscillating transistors are directly connected together via capacitors, this invention is not limited to this aspect but only both bases of them may be directly connected together via a capacitor as shown in FIG. 17, or only both emitters of them may be directly connected together via a capacitor as shown in FIG. 18. In FIG. 3, only both collectors of the transistors may be directly connected together via a capacitor, or only both emitters of the transistors may be directly connected together via a capacitor. In this case, the base and the collector may be directly connected together without a capacitor.

What is claimed is:

1. A high-frequency oscillating circuit comprising a first oscillating transistor; a first capacitor connected between the collector and emitter of the first oscillating transistor; a second oscillating transistor; a second capacitor connected between the collector and emitter of the second oscillating transistor; a third capacitor one end of which is connected to the collector of said first oscillating transistor; a fourth capacitor one end of which is connected to the collector of said second oscillating transistor; a resonator connected between the other ends of said third capacitor and said fourth capacitor; a fifth capacitor connected between the emitters of said first and second oscillating transistors; a sixth capacitor one end of which is connected to the emitter of said first oscillating transistor; and a seventh capacitor one end of which is connected to the emitter of said second oscillating transistor, wherein the bases of said first and second oscillating transistors are connected together directly or via an eighth capacitor the impedance of which is lower than a predetermined value at an oscillating frequency, and wherein an oscillating output is obtained via said sixth and seventh capacitors.

2. A high-frequency oscillating circuit comprising a first oscillating transistor; a first capacitor connected between the base and emitter of the first oscillating transistor; a second oscillating transistor; a second capacitor connected between the base and emitter of the second oscillating transistor; a third capacitor one end of which is connected to the base of said first oscillating transistor; a fourth capacitor one end of which is connected to the base of said second oscillating transistor; a resonator connected between the other ends of said third capacitor and said fourth capacitor; a fifth capacitor connected between the emitters of said first and second oscillating transistors; a sixth capacitor one end of which is connected to the emitter of said first oscillating transistor; and a seventh capacitor one end of which is connected to the emitter of said second oscillating transistor, wherein the collectors of said first and second oscillating transistors are connected together directly or via an eighth capacitor the impedance of which is lower than a predetermined value at an oscillating frequency, and wherein an oscillating output is obtained via said sixth and seventh capacitors.

3. A high-frequency oscillating circuit comprising first and second oscillating transistors, wherein the bases of said first and second transistors are connected together directly or via a first capacitor the impedance of which is lower than a predetermined value at an oscillating frequency, and wherein a differential signal output is obtained between emitters of said first and second oscillating transistors as an oscillating output, a first buffer amplifier transistor the base of which is connected to the output from the emitter of said first oscillating transistor; and a second buffer amplifier transistor the base of which is connected to the output from the emitter of said second oscillating transistor, wherein the emitters of the first and second buffer amplifier transistors are connected together directly or via a second capacitor the impedance of which is lower than the predetermined value at an oscillating frequency, and wherein after amplification, a differential signal output is obtained between the collectors of said first and second buffer amplifier transistors as an oscillating output.

4. A high-frequency oscillating circuit comprising: first and second oscillating transistors, wherein the collectors of said first and second oscillating transistors are connected together directly or via a first capacitor the impedance of which is lower than a predetermined value at an oscillating frequency, and a differential signal output is obtained between the emitters of said first and second oscillating transistors as an oscillating output; and a first buffer amplifier transistor the base of which is connected to the output from the emitter of said first oscillating transistor; and a second buffer amplifier transistor the base of which is connected to the output from the emitter of said second oscillating transistor, wherein the emitters of the first and second buffer amplifier transistors are connected together directly or via a second capacitor the impedance of which is lower than the predetermined value at the oscillating frequency, and wherein after amplification, a differential signal output is obtained between the collectors of said first and second buffer amplifier transistors as an oscillating output.

5. A high-frequency oscillating circuit according to claim 3 wherein the predetermined value of the impedance of said first capacitor is a value at which oscillation occurs.

6. A high-frequency oscillating circuit according to claim 3 comprising a first inductor connected between the collector of said first oscillating transistor and the emitter of said first buffer amplifier transistor; and a second inductor connected between the collector of said second oscillating transistor and the emitter of said second buffer amplifier transistor.

7. A high-frequency oscillating circuit according to claim 4 wherein the collector of said first oscillating transistor is connected to the emitter of said first buffer amplifier transistor, and the collector of said second oscillating transistor is connected to the emitter of said second buffer amplifier transistor.

8. A resonating circuit comprising a module including a resonator having a length substantially equal to half a wavelength at a resonance frequency; first and second varactor diodes having their cathodes connected together; and a plurality of connection points to an external negative-resistance-generating circuit formed inside an integrated circuit, said integrated circuit separate from said module and connected together at said plurality of connection points wherein said resonator is formed from a strip line secured to a dielectric substrate, a connection pattern between the cathodes of said first and second varactor diodes is formed from a conductor pattern on said dielectric substrate, and said first and second varactor diodes are mounted on said connection pattern as bare chips.

9. An oscillating circuit comprising a resonating circuit including a resonator having a length substantially equal to half a wavelength at a resonance frequency, first and second varactor diodes having their cathodes connected together, and a plurality of connection points to an external negative-resistance-generating circuit, wherein said plurality of connection points include first and second connection points, a first capacitor connected between an anode of said first varactor diode and one end of said resonator; a second capacitor connected between an anode of said second varactor diode and another end of said resonator; first and second choke coils connected in series between the anodes of said first and second varactor diodes; third and fourth capacitors each having one end connected to one end of said resonator and the other end connected to said first and second connection points, respectively; a third choke coil one end of which is connected to the cathodes of said first and second varactor diodes; and a fifth capacitor connected between the other end of the third choke coil and said series connected first and second choke coils; and an external negative-resistance-generating circuit formed inside an integrated circuit, wherein said external negative-resistance-generating circuit has a first oscillating transistor; a first capacitor connected between the collector and emitter of the first oscillating transistor; a second oscillating transistor; a second capacitor connected between the collector and emitter of the second oscillating transistor; a third capacitor one end of which is connected to the collector of said first oscillating transistor; a fourth capacitor one end of which is connected to the collector of said second oscillating transistor; a fifth capacitor connected between the emitters of said first and second oscillating transistors; a sixth capacitor one end of which is connected to the emitter of said first oscillating transistor; and a seventh capacitor one end of which is connected to the emitter of said second oscillating transistor, the bases of said first and second oscillating transistors being connected together directly or via an eighth capacitor the impedance of which is lower than a predetermined value at an oscillating frequency, wherein the first connection point of said resonating circuit is connected to the collector of said first oscillating transistor, wherein the second connection point of said resonating circuit is connected to the collector of said second oscillating transistor, and wherein an oscillating output is obtained via said sixth and seventh capacitors.

10. An oscillating circuit comprising a resonating circuit including a resonator having a length substantially equal to half a wavelength at a resonance frequency, first and second varactor diodes having their cathodes connected together, and a plurality of connection points to an external negative-resistance-generating circuit, wherein said plurality of connection points include first and second connection points, a first capacitor connected between an anode of said first varactor diode and one end of said resonator; a second capacitor connected between an anode of said second varactor diode and another end of said resonator; first and second choke coils connected in series between the anodes of said first and second varactor diodes; third and fourth capacitors each having one end connected to one end of said resonator and the other end connected to said first and second connection points, respectively; a third choke coil one end of which is connected to the cathodes of said first and second varactor diodes; and a fifth capacitor connected between the other end of the third choke coil and said series connected first and second choke coils; and an external negative-resistance-generating circuit formed inside an integrated circuit, wherein said external negative-resistance-generating circuit has a first oscillating transistor; a first capacitor connected between the base and emitter of the first oscillating transistor; a second oscillating transistor; a second capacitor connected between the base and emitter of the second oscillating transistor; a third capacitor one end of which is connected to the base of said first oscillating transistor; a fourth capacitor one end of which is connected to the base of said second oscillating transistor; a fifth capacitor connected between the emitters of said first and second oscillating transistors; a sixth capacitor one end of which is connected to the emitter of said first oscillating transistor; and a seventh capacitor one end of which is connected to the emitter of said second oscillating transistor, the collectors of said first and second oscillating transistors being connected together directly or via an eighth capacitor the impedance of which is lower than a predetermined value at an oscillating frequency, wherein the first connection point of said resonating circuit is connected to the base of said first oscillating transistor, wherein the second connection point of said resonating circuit is connected to the base of said second oscillating transistor, and wherein an oscillating output is obtained via said sixth and seventh capacitors.

11. A resonating circuit comprising a resonator having a length substantially equal to half a wavelength at a resonance frequency, first and second varactor diodes having their cathodes connected together, and a plurality of connection points connected to an external negative-resistance-generating circuit, wherein said plurality of connection points include first and second connection points, a first capacitor connected between an anode of said first varactor diode and one end of said resonator; a second capacitor connected between an anode of said second varactor diode and another end of said resonator; first and second choke coils connected in series between the anodes of said first and second varactor diodes; third and fourth capacitors each having one end connected to one end of said resonator and the other end connected to said first and second connection points, respectively; a third choke coil one end of which is connected to the cathodes of said first and second varactor diodes; and a fifth capacitor connected between the other end of the third choke coil and said series connected first and second choke coils;

wherein said resonator is a strip line formed inside a dielectric, wherein said first to fifth capacitors are a coupling capacity between conductor patterns formed in the upper and lower parts of said dielectric, wherein said first to third choke coils are strip lines formed inside said dielectric and are modularized inside said dielectric.

12. An oscillating circuit comprising a resonating circuit including a resonator having a length substantially equal to half a wavelength at a resonance frequency; first and second varactor diodes having their cathodes connected together; and a plurality of connection points to an external negative-resistance-generating circuit, the external negative-resistance-generating circuit connected to each of said connection points of the resonating circuit and formed inside an integrated circuit, and said resonating circuit is mounted outside said IC package, wherein said resonator is formed from a strip line on a dielectric substrate, a connection pattern between the cathodes of said first and second varactor diodes is formed from a conductor pattern on said dielectric substrate, and said first and second varactor diodes are mounted on said connection pattern as bare chips.

13. An oscillating circuit comprising a resonator circuit including a resonator having a length substantially equal to half a wavelength at a resonance frequency; first and second varactor diodes having their cathodes connected together; and a plurality of connection points to an external negative-resistance-generating circuit, wherein said plurality of connection points comprise first to fifth connection points, wherein one end of said resonator is connected to said first connection point, the other end of said resonator is connected to said second connection point, the anode of said first varactor diode is connected to said third connection point, the connection point between the cathodes of said first and second varactor diodes is connected to said fourth connection point and the anode of said second varactor diode is connected to said fifth connection point; and the external negative-resistance-generating circuit formed inside an integrated circuit, wherein said external negative-resistance-generating circuit has a first oscillating transistor; a second oscillating transistor; a first capacitor connected between a collector and emitter of the first oscillating transistor; a second capacitor connected between a collector and emitter of the second oscillating transistor; a third capacitor connected between the collector and a base of said first oscillating transistor; a fourth capacitor connected between the collector and a base of said second oscillating transistor; a fifth capacitor connected between the bases of said first and second oscillating transistors; a sixth capacitor connected between the emitters of said first and second oscillating transistors; a seventh capacitor having one end connected to the emitter of said first oscillating transistor; an eighth capacitor having one end connected to the emitter of said second oscillating transistor; a ninth capacitor having one end connected to the collector of said first oscillating transistor; a tenth capacitor having one end connected to the collector of said second oscillating transistor; an eleventh capacitor having one end connected to the other end of said ninth capacitor; a twelfth capacitor having one end connected to the other end of paid tenth capacitor; a first choke coil having one end connected to the other end of said eleventh capacitor; a second choke coil having one end connected to the other end of said twelfth capacitor and the other end connected to the other end of said first choke coil; and a third choke coil; and the first connection point of said resonating circuit connected to said other end of said ninth capacitor, the second connection point of said resonating circuit connected to said other end of said tenth capacitor, the third connection point of said resonating circuit connected to said one end of said first choke coil, the fifth connection point of said resonating circuit connected to said one end of said second choke coil, the fourth connection point of said resonating circuit connected to the one end of said third choke coil, and wherein a differential signal out is obtained between the other ends of said seventh and eighth capacitors at an oscillating output.

14. An oscillating circuit comprising a resonator circuit including a resonator having a length substantially equal to half a wavelength at a resonance frequency; first and second varactor diodes having their cathodes connected together; and a plurality of connection points to an external negative-resistance-generating circuit, wherein said plurality of connection points comprise first to fifth connection points, wherein one end of said resonator is connected to said first connection point, the other end of said resonator is connected to said second connection point, the anode of said first varactor diode is connected to said third connection point, the connection point between the cathodes of said first and second varactor diodes is connected to said fourth connection point and the anode of said second varactor diode is connected to said fifth connection point; and the external negative-resistance-generating circuit formed inside an integrated circuit, wherein aid external negative-resistance-generating circuit has a first oscillating transistor; a second oscillating transistor; a first capacitor connected between base and emitter of said first oscillating transistor; a second capacitor connected between a base and emitter of said second oscillating transistor; third capacitor connected between collectors of said first and second oscillating transistors; a fourth capacitor connected between the emitters of said fist and second oscillating transistors; a fifth capacitor having one end collected to the emitter of said first oscillating transistor; a sixth capacitor having one end connected to the emitter of said second oscillating transistor; seventh capacitor having one end connected to the base of said first oscillating transistor; an eighth capacitor having one end connected to the base of said second oscillating transistor, a ninth capacitor having one end connected to the other end of said seventh capacitor; a tenth capacitor having one end corrected to the other end of said eighth capacitor; a first choke coil having one end connected to the other end of said ninth capacitor; a second choke coil having one end connected to the other end of said tenth capacitor and the otter end connected to the other end of said first choke coil; and a third choke coil; and the first connection point of said resonating circuit connected to the other end of said seventh capacitor, the second connection point of said resonating circuit connected to said other end of said eighth capacitor, the third connection point of said resonating circuit connected to said one end of said first choke coil, the fifth connection point of said resonating circuit connected to said one end of said second choke coil, the fourth connection point of said resonating circuit connected t the one end of said third choke coil, and wherein a differential signal output is obtained between the other ends of said fifth and sixth capacitors as an oscillating output.

15. An oscillating circuit according to claim 13 wherein said external negative-resistance-generating circuit and resonating circuit are mounted in an IC package.

16. An oscillating circuit according to claim 13 wherein said resonator is formed of a strip line on a dielectric substrate, wherein a connection pattern between the cathodes of said first and second varactor diodes is formed of a conductor pattern on said dielectric substrate, wherein said first and second varactor diodes are mounted on said connection pattern as bare chips, and wherein said external negative-resistance-generating circuit is mounted on said dielectric substrate.

17. A high-frequency oscillating circuit according to claim 4 wherein the predetermined value of the impedance of said first capacitor is a value at which oscillation occurs.

18. A high-frequency oscillating circuit according to claim 1 wherein the predetermined value of the impedance of said eighth capacitor is a value at which oscillation can occur.

19. A high-frequency oscillating circuit according to claim 2 wherein the predetermined value of the impedance of said eighth capacitor is a value at which oscillation can occur.

20. A high-frequency oscillating circuit according to claim 3 wherein he predetermined value of the impedance of said first capacitor is a value at which oscillation can occur.

21. A high-frequency oscillating circuit according to claim 4 wherein the predetermined value of the impedance of said first capacitor is a value at which oscillation can occur.

22. An oscillating circuit according to claim 9 wherein said external negative-resistance-generating circuit is mounted inside an IC package, and said resonating circuit is mounted outside said IC package.

23. An oscillating circuit according to claim 10 wherein said external negative-resistance-generating circuit is mounted inside an IC package, and said resonating circuit is mounted outside said IC package.

24. An oscillating circuit according to claim 22 wherein said resonator is formed of a strip line on a dielectric substrate, wherein a connection pattern between the cathodes of said first and second varactor diodes is formed of a conductor pattern on said dielectric substrate, and wherein said first and second varactor diodes are mounted on said connection pattern as bare chips.

25. A oscillating circuit according to claim 23 wherein said resonator is formed of a strip line on a dielectric substrate, wherein a connection pattern between the cathodes of said first and second varactor diodes is formed of a conductor pattern on said dielectric substrate, and wherein said first and second varactor diodes are mounted on said connection pattern as bare chips.

26. An oscillating circuit according to claim 14 wherein said external negative-resistance-generating circuit and resonating circuit are mounted in an IC package.

27. An oscillating circuit according to claim 14 wherein said resonator is formed of a strip line on a dielectric substrate, wherein a connection pattern between the cathodes of said first and second varactor diodes is formed of a conductor pattern on said dielectric substrate, wherein said first and second varactor diodes are mounted on said connection pattern as bare chips, and wherein said external negative-resistance-generating circuit is mounted on said dielectric substrate.

28. A resonating circuit including a module, an integrated circuit, and a plurality of leads for connecting the module and the integrated circuit, wherein the module and the integrated circuit are formed separately;
the module comprising
(1) a resonator hiving a length substantially equal to half a wavelength at a resonance frequency,
(2) first and second varactor diodes having their cathodes connected together and their anodes coupled to the resonator; and
(3) a plurality of first connection points; and
the integrated circuit comprising
(1) a negative-resistance-generating circuit, and
(2) a plurality of second connection points,
wherein when each of the plurality of leads interconnect each of the plurality of first connection points to each of the plurality of second connection points, the resonance frequency is provided as an output from the negative-resistance-generating circuit,
said resonator is formed from a strip line secured to a dielectric substrate, a connection pattern between the cathodes of said first and second varactor diodes is formed from a conductor pattern on said dielectric substrate, and said first and second varactor diodes are mounted on said connection pattern as bare chips.

* * * * *

UNITED STATES PATENT AND TRADEMARK OFFICE
CERTIFICATE OF CORRECTION

PATENT NO. : 6,169,461 B1
DATED : January 2, 2001
INVENTOR(S) : Andoh et al.

Page 1 of 1

It is certified that error appears in the above-identified patent and that said Letters Patent is hereby corrected as shown below:

Column 24,
Line 6, "paid" should read -- said --.
Line 41, "aid" should read -- said --.
Line 49, "fist" should read -- first --.
Line 51 and 59, "collected" should read -- connected --.
Line 64, "otter" should read -- other --.

Column 25,
Line 7, "t" should read -- to --.

Column 26,
Line 29, "hiving" should read -- having --.

Signed and Sealed this

Twelfth Day of March, 2002

Attest:

Attesting Officer

JAMES E. ROGAN
Director of the United States Patent and Trademark Office